(12) United States Patent
Gronheid et al.

(10) Patent No.: US 12,153,352 B2
(45) Date of Patent: Nov. 26, 2024

(54) SYSTEM AND METHOD FOR FOCUS CONTROL IN EXTREME ULTRAVIOLET LITHOGRAPHY SYSTEMS USING A FOCUS-SENSITIVE METROLOGY TARGET

(71) Applicant: KLA Corporation, Milpitas, CA (US)

(72) Inventors: Roel Gronheid, Leuven (BE); Xuemei Chen, Austin, TX (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/959,142

(22) Filed: Oct. 3, 2022

(65) Prior Publication Data

US 2023/0037093 A1 Feb. 2, 2023

Related U.S. Application Data

(62) Division of application No. 17/143,899, filed on Jan. 7, 2021, now Pat. No. 11,460,783.

(51) Int. Cl.
*G03F 7/00* (2006.01)
*H01L 21/027* (2006.01)

(52) U.S. Cl.
CPC ...... *G03F 7/70641* (2013.01); *G03F 7/70625* (2013.01); *G03F 7/70633* (2013.01); *H01L 21/027* (2013.01)

(58) Field of Classification Search
CPC ............. G03F 7/70641; G03F 7/70625; G03F 7/70633; G03F 7/70683; H01L 21/027
See application file for complete search history.

(56) References Cited

U.S. PATENT DOCUMENTS

| | | | |
|---|---|---|---|
| 7,349,105 B2 | 3/2008 | Weiss | |
| 7,440,105 B2 | 10/2008 | Adel et al. | |
| 7,541,201 B2 | 6/2009 | Ghinovker | |
| 8,330,281 B2 | 12/2012 | Ghinovker et al. | |
| 9,214,317 B2 | 12/2015 | Shur | |
| 9,476,698 B2 | 10/2016 | Abdulhalim et al. | |
| 9,588,440 B2 | 3/2017 | Brunner et al. | |
| 10,001,711 B2 | 6/2018 | Dommelen et al. | |

(Continued)

FOREIGN PATENT DOCUMENTS

WO 2018004511 A1 1/2018

OTHER PUBLICATIONS

International Search Report and Written in International Application No. PCT/US2021/065419 dated May 2, 2022.

*Primary Examiner* — Hung V Nguyen
(74) *Attorney, Agent, or Firm* — Suiter Swantz IP

(57) ABSTRACT

A focus-sensitive metrology target may be formed and read-out by a fabrication tool. A resulting overlay signal may be translated into a focus offset by comparison to a previously-determined calibration curve. One or more translated signals may be fed back to the fabrication tool for focus correction or used for prediction of on-device overlay (correction of overlay metrology results). In one embodiment, focus and overlay may be measured using a single target, where one portion of the target is formed on a first layer and includes a focus-sensitive design, and where another portion of the target is formed on a second layer and includes a relatively less focus-sensitive design. In some embodiments, a relative difference in focus response may be used to estimate an impact of focus error on device overlay and calculate non-zero offset contributions.

13 Claims, 11 Drawing Sheets

(56) References Cited

U.S. PATENT DOCUMENTS

| | | |
|---|---|---|
| 10,190,979 B2 | 1/2019 | Manassen et al. |
| 10,527,951 B2 | 1/2020 | Yohanan et al. |
| 11,204,239 B2 * | 12/2021 | Bhattacharyya .... G03F 7/70683 |
| 2013/0035888 A1 | 2/2013 | Kandel et al. |
| 2015/0323471 A1 | 11/2015 | Sapiens et al. |
| 2016/0291482 A1 | 10/2016 | Shih et al. |
| 2016/0334716 A1 | 11/2016 | Mieher |
| 2018/0188663 A1 | 7/2018 | Levinski et al. |
| 2018/0196358 A1 | 7/2018 | Lee et al. |
| 2019/0179231 A1 * | 6/2019 | Laske ................. H01L 22/20 |
| 2019/0252270 A1 | 8/2019 | Hoo et al. |
| 2020/0310242 A1 | 10/2020 | Haren et al. |
| 2021/0200105 A1 | 7/2021 | Leshinsky-Altshuller et al. |
| 2021/0240089 A1 * | 8/2021 | Golotsvan ............ G01N 21/956 |
| 2021/0364279 A1 | 11/2021 | Manassen et al. |

\* cited by examiner

SYSTEM AND METHOD FOR FOCUS CONTROL IN EXTREME ULTRAVIOLET LITHOGRAPHY SYSTEMS USING A FOCUS-SENSITIVE METROLOGY TARGET

CROSS-REFERENCE TO RELATED APPLICATION

The present application is a divisional application and claims the benefit of U.S. Non-Provisional application Ser. No. 17/143,899, filed Jan. 7, 2021, which is incorporated herein by reference in the entirety.

TECHNICAL FIELD

The present disclosure is related generally to focus control in extreme ultraviolet lithography process using focus-sensitive metrology targets. More specifically, the present disclosure relates to correction of focus-induced overlay metrology target-to-device errors.

BACKGROUND

Focus control in EUV lithography is increasingly important, due to non-overlapping process windows for different structures (e.g., 3D mask effects). Moreover, random defects strongly increase in density when moving out of best focus. Defects in overlay metrology targets may occur as a result of improper focus control during one or more aspects of the fabrication process. Existing methods of preventing defects (e.g., by controlling focus of one or more portions of a fabrication tool) frequently involve and require significant measurement acquisition time. Additionally, as the size of overlay metrology target features continues to decrease with evolving metrology methods capable of controlling focus at higher resolutions. Moreover, existing methods of focus control are generally incompatible with focus and overlay metrology using a single target (e.g., correction of focus-induced overlay metrology errors using one or more focus measurements).

Accordingly, it may be desirable to provide a system and method for focus control using a focus-sensitive metrology target.

SUMMARY

A focus-sensitive metrology target is disclosed, in accordance with one or more embodiments of the present disclosure. In one embodiment, the focus-sensitive metrology target may include a first set of first target structures formed along a y-direction on one or more layers of a sample, the first set of first target structures comprising a plurality of segmented first pattern elements. In another embodiment, the focus-sensitive metrology target includes a first set of second target structures formed along a y-direction on one or more layers of the sample, the first set of second target structures comprising a plurality of segmented second pattern elements.

A system is disclosed, in accordance with one or more embodiments of the present disclosure. In one embodiment, one or more controllers having one or more processors communicatively coupled to one or more fabrication tools, wherein the one or more processors are configured to execute a set of program instructions maintained in memory, and wherein the set of program instructions is configured to cause the one or more processors to: receive, from one or more portions of one or more fabrication tools, one or more signals indicative of illumination emanating from a first set of first target structures and a first set of second target structures of one or more focus-sensitive metrology targets of a sample, wherein the one or more focus-sensitive metrology targets of the sample comprise: a first set of first target structures formed along a y-direction on one or more layers of a sample, the first set of first target structures comprising a plurality of segmented first pattern elements; and a first set of second target structures formed along a y-direction on one or more layers of the sample; determine one or more focus-offset values based on the one or more signals indicative of illumination emanating from the first set of first target structures and the first set of second target structures; and provide one or more focus corrections based on the one or more focus-offset values to one or more portions of the one or more fabrication tools.

A method of measuring overlay is disclosed, in accordance with one or more embodiments of the present disclosure. In one embodiment, the method includes illuminating a sample having one or more focus-sensitive metrology targets. In another embodiment, the method includes detecting, in one or more metrology modes, one or more signals indicative of illumination emanating from one or more portions of the one or more focus-sensitive metrology targets, wherein the one or more focus-sensitive metrology targets of the sample comprise a first set of first target structures formed along a y-direction on one or more layers of a sample, the first set of first target structures comprising a plurality of segmented first pattern elements; and a first set of second target structures formed along a y-direction on one or more layers of the sample. In another embodiment, the method includes generating one or more overlay measurements based on the one or more signals indicative of illumination emanating from the one or more portions of the one or more focus-sensitive metrology targets. In another embodiment, the method includes determining an overlay error between two or more layers of the sample based on the one or more overlay measurements.

A method of forming a focus-sensitive metrology target is disclosed, in accordance with one or more embodiments of the present disclosure. In one embodiment, the method includes forming a first set of first target structures along a y-direction on one or more layers of a sample, the first set of first target structures comprising a plurality of segmented first pattern elements. In another embodiment, the method includes forming a first set of second target structures along a y-direction on one or more layers of the sample, the first set of second target structures comprising a plurality of segmented second pattern elements.

BRIEF DESCRIPTION OF DRAWINGS

The numerous advantages of the disclosure may be better understood by those skilled in the art by reference to the accompanying figures.

DETAILED DESCRIPTION

Figure 1A:
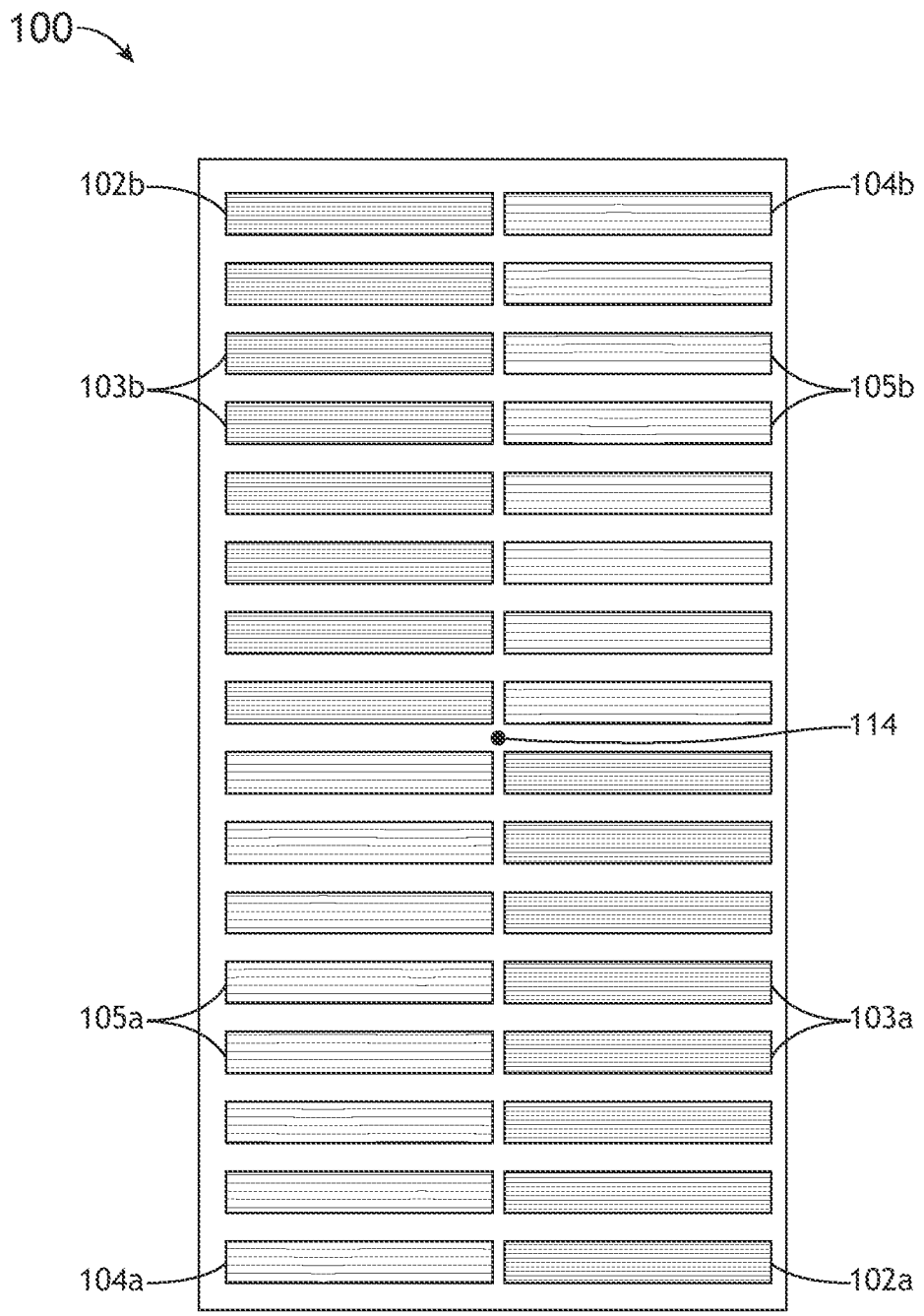
FIG. 1A is a top view of a focus-sensitive metrology target, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Embodiments of the present disclosure are directed to systems and methods for focus control in extreme ultraviolet lithography systems using a focus-sensitive metrology target. Specifically, embodiments of the present disclosure are directed to systems and methods of controlling focus of one or more portions of an overlay metrology target fabrication tool frequently that decrease measurement acquisition time and that are configurable to permit correction of focus-induced overlay metrology errors using one or more focus measurements.

A semiconductor device may be formed as multiple printed layers of patterned material on a substrate. Each printed layer may be fabricated through a series of process steps such as, but not limited to, one or more material deposition steps, one or more lithography steps, or one or more etching steps. During fabrication, each printed layer must typically be fabricated within selected tolerances to properly construct the final device. For example, the relative placement of printed elements in each layer (e.g., the overlay or the overlay parameters) must be well characterized and controlled with respect to previously fabricated layers. Accordingly, metrology targets may be fabricated on one or more printed layers to enable efficient characterization of the overlay of the layers. Deviations of focus-sensitive metrology target features on a printed layer (e.g., pattern placement errors (PPE) in a particular layer or overlay errors associated with registration errors between sample layers) may thus be representative of deviations of printed characteristics of printed device features on that layer. Further, overlay measured at one fabrication step (e.g., after the fabrication of one or more sample layers) may be used to generate correctables for precisely aligning a process tool (e.g., a lithography tool, or the like) for the fabrication of an additional sample layer in a subsequent fabrication step.

Focus-sensitive metrology targets typically include features specifically designed to be sensitive to overlay errors between sample layers of interest. An overlay-type measurement may then be carried out by characterizing the focus-sensitive metrology target using an overlay metrology tool and applying an algorithm to determine overlay errors on the sample based on the output of the metrology tool.

Overlay metrology tools may utilize a variety of techniques to determine the overlay of sample layers. For example, image-based overlay metrology tools may illuminate a focus-sensitive metrology target (e.g., an advanced imaging metrology (AIM) target, a box-in-box metrology target, or the like) and capture an overlay signal including an image of focus-sensitive metrology target features located on different sample layers. By way of another example, scatterometry-based overlay metrology tools may illuminate a focus-sensitive metrology target (e.g., a grating-over-grating metrology target, or the like) and capture an overlay signal including an angular distribution of radiation emanating from the focus-sensitive metrology target associated with diffraction, scattering, and/or reflection of the illumination beam. It is recognized herein that various overlay metrology tools may be used to measure overlay. For example, optical metrology tools (e.g., light-based metrology tools using electromagnetic radiation for illumination and/or detection) may provide high-throughput overlay measurements using numerous techniques such as, but not limited to, determining relative positions of spatially-separated features on multiple layers in an image, directly measuring PPE on multiple layers, or scatterometry in which overlay is determined based on light scattered and/or diffracted from diffraction gratings on multiple layers. For the purposes of the present disclosure, the term "optical metrology tools," "optical metrology techniques," and the like indicate metrology tools and techniques using electromagnetic radiation of any wavelength such as, but not limited to, x-ray wavelengths, extreme ultraviolet (EUV) wavelengths, vacuum ultraviolet (VUV) wavelengths, deep ultraviolet (DUV) wavelengths, ultraviolet (UV) wavelengths, visible wavelengths, or infrared (IR) wavelengths. Systems, methods, and apparatuses related to overlay measurement are generally described in U.S. Pat. No. 8,330,281 titled "OVERLAY MARKS, METHODS OF OVERLAY MARK DESIGN AND METHODS OF OVERLAY MEASUREMENTS" and issued on Dec. 11, 2012, U.S. Pat. No. 9,476,698 titled "PERIODIC PATTERNS AND TECHNIQUE TO CONTROL MISALIGNMENT BETWEEN TWO LAYERS" and issued on Oct. 25, 2016, U.S. Pat. No. 7,541,201 titled "APPARATUS AND METHODS FOR DETERMINING OVERLAY OF STRUCTURES HAVING ROTATIONAL OR MIRROR SYMMETRY" and issued on Jun. 2, 2009, U.S. Patent Publication No. 2013/0035888 titled "METHOD AND SYSTEM FOR PROVIDING A QUALITY METRIC FOR IMPROVED PROCESS CONTROL" and published on Feb. 7, 2013, U.S. Pat. No. 9,214,317 titled "SYSTEM AND METHOD OF SEM OVERLAY METROLOGY" issued on Dec. 15, 2015, U.S. Pat. No. 10,527,951 B2 titled "COMPOUND IMAGING METROLOGY TARGETS" issued on Jan. 7, 2020, U.S. Pat. No. 10,190,979 B2 titled "METROLOGY IMAGING TARGETS HAVING REFLECTION-SYMMETRIC PAIRS OF REFLECTION-ASYMMETRIC STRUCTURES" issued on Jan. 29, 2019, and PCT Application No. PCT/

US2016/039531 titled "APPARATUS AND METHOD FOR THE MEASUREMENT OF PATTERN PLACEMENT AND SIZE OF PATTERN AND COMPUTER PROGRAM THEREFOR" and filed on Jun. 27, 2016, all of which are incorporated herein by reference in their entirety.

FIG. 1A is a top view of a focus-sensitive metrology target 100, in accordance with one or more embodiments of the present disclosure. In some embodiments, one or more portions of the focus-sensitive metrology target 100 (e.g., target structures) may be formed on a same layer of the focus-sensitive metrology target 100.

The focus-sensitive metrology target 100 may include a first set of first target structures 102a and 102b formed on one or more layers of a sample (e.g., a current layer and/or a previous layer of the sample). The first set of first target structures 102a and 102b may include a plurality of segmented first pattern elements 103a and 103b having a first pitch. The first pitch may be of a value greater than a resolution of one or more portions of one or more metrology tools configured to perform one or more measurements of one or more portions of the focus-sensitive metrology target 100 (or another focus-sensitive metrology target). In this way, the segmented first pattern elements 103a and 103b may be configured to facilitate the generation of one or more less-focused images (e.g., when captured by one or more portions of the one or more metrology tools).

The plurality of segmented first pattern elements 103a and 103b may be configured for overlay measurement along at least one measurement direction (e.g., a y-direction). The plurality of segmented first pattern elements 103a and 103b may be compatible with any metrology mode known in the art to be suitable for the purposes contemplated by the present disclosure. For example, the one or more first pattern elements 103a and 103b may be compatible with a diffraction-based metrology mode (e.g., a scatterometry-based overlay (SCOL) metrology mode). In this regard, the one or more first pattern elements 103a and 103b may be configured to include periodic and/or segmented structures for metrology using diffraction-based metrology methods (e.g., grating-over-grating structures, or any structure known in the art to be suitable for diffracting, scattering, and/or reflecting an illumination beam). By way of another example, the one or more first pattern elements 103a and 103b may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of focus-sensitive metrology target features located on different sample layers).

It is noted that the plurality of segmented first pattern elements 103a and 103b may include any one-dimensional or two-dimensional structure formed by any means known in the art, including, without limitation, one or more lithographic steps, one or more direct etching steps, or the like. The first set of first target structures 102a and 102b and/or the plurality of segmented first pattern elements 103a and 103b may be formed in any shape, including, without limitation, a square shape, a round shape, a rhombus-like shape, or a star-like shape.

The focus-sensitive metrology target 100 may include a first set of second target structures 104a and 104b formed on one or more layers of the sample (e.g., a current layer and/or a previous layer of the sample). The first set of second target structures 104a and 104b may include a plurality of segmented second pattern elements 105a and 105b having a second pitch. The second pitch may be of a value less than the resolution of one or more portions of one or more metrology tools configured to perform one or more measurements of one or more portions of the focus-sensitive metrology target 100 (or any metrology target). In this way, the segmented second pattern elements 105a and 105b may be configured to facilitate the generation of one or more more-focused images (e.g., when captured by one or more portions of the one or more metrology tools).

The plurality of segmented second pattern elements 105a and 105b may be configured for overlay measurement along at least one measurement direction (e.g., a y-direction). The plurality of segmented second pattern elements 105a and 105b may be compatible with any metrology mode known in the art to be suitable for the purposes contemplated by the present disclosure. For example, the one or more second pattern elements 105a and 105b may be compatible with a diffraction-based metrology mode (e.g., a scatterometry-based overlay (SCOL) metrology mode). In this regard, the one or more second pattern elements 105a and 105b may be configured to include periodic and/or segmented structures for metrology using diffraction-based metrology methods (e.g., grating-over-grating structures, or any structure known in the art to be suitable for diffracting, scattering, and/or reflecting an illumination beam). By way of another example, the one or more second pattern elements 105a and 105b may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of focus-sensitive metrology target features located on different sample layers).

It is noted that the plurality of segmented second pattern elements 105a and 105b may include any one-dimensional or two-dimensional structure formed by any means known in the art, including, without limitation, one or more lithographic steps, one or more direct etching steps, or the like. The first set of second target structures 104a and 104b and/or the plurality of segmented second pattern elements 105a and 105b may be formed in any shape, including, without limitation, a square shape, a round shape, a rhombus-like shape, or a star-like shape.

Figure 1B:
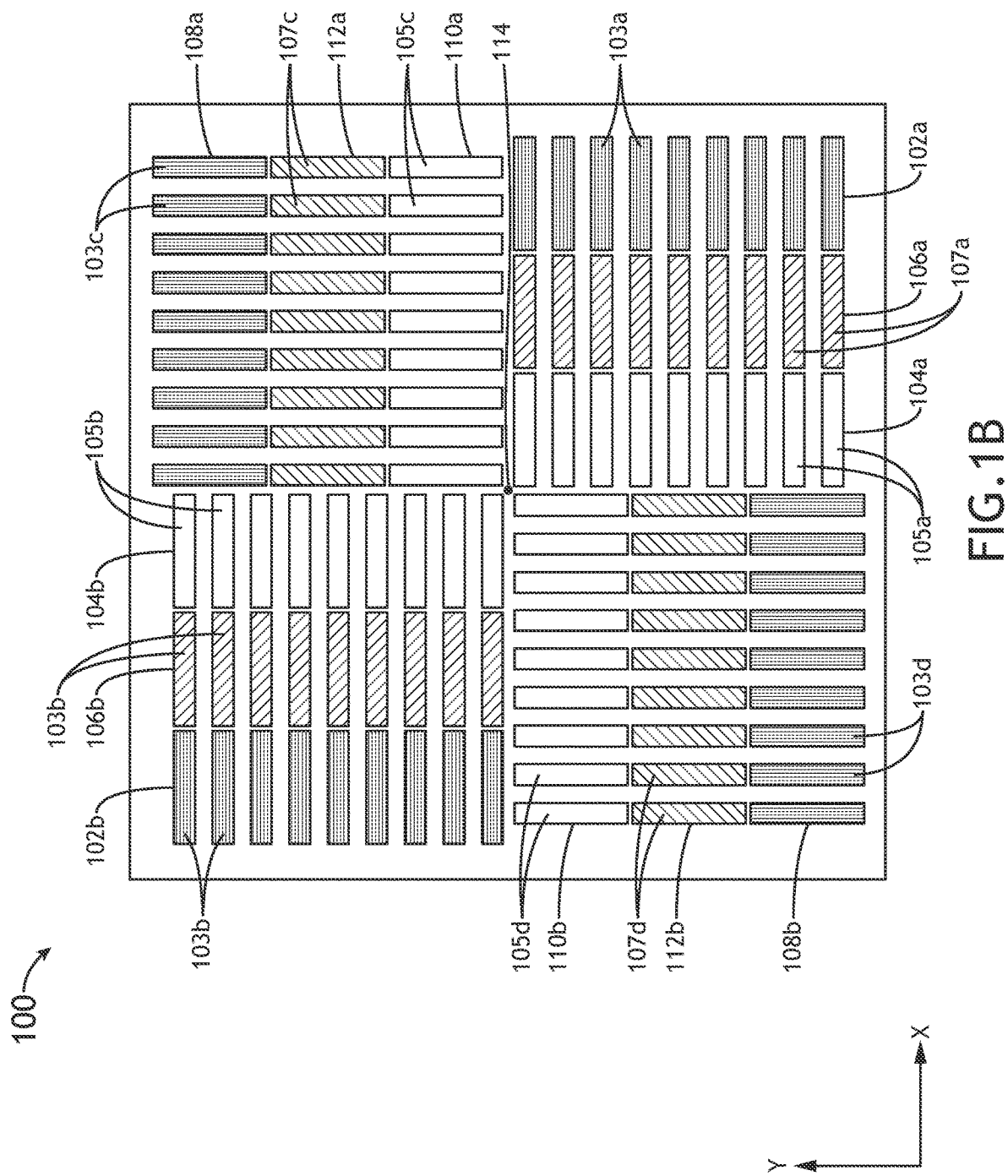
FIG. 1B is a top view of a focus-sensitive metrology target, in accordance with one or more embodiments of the present disclosure.

In some embodiments, as shown in FIG. 1B, the focus-sensitive metrology target 100 may include a first set of third target structures 106a and 106b formed on one or more layers of the sample (e.g., a current layer and/or a previous layer of the sample). The first set of third target structures 106a and 106b may include a plurality of segmented third pattern elements 107a and 107b. The segmented third pattern elements 107a and 107b may have the first pitch, the second pitch, or a third pitch. The third pitch may be equivalent to the first pitch and/or the second pitch, or may be different from the first pitch and/or the second pitch. The third pitch may be configured to facilitate one or more overlay measurements between two layers of the sample (e.g., the third pitch may be configured such that the third pitch, along with at least one of the first pitch or the second pitch, may produce one or more overlay metrology signals indicative of an overlay error between two sample layers).

It is specifically noted that, in some embodiments, one or more portions (e.g. target structures) of the focus-sensitive metrology target 100 may be formed on a layer different from a layer on which one or more other portions of the focus-sensitive metrology target 100 are formed.

The plurality of segmented third pattern elements 107a and 107b may be configured for overlay measurement along at least one measurement direction (e.g., a y-direction). The plurality of segmented third pattern elements 107a and 107b may be compatible with any metrology mode known in the art to be suitable for the purposes contemplated by the present disclosure. For example, the one or more third pattern elements 107a and 107b may be compatible with a diffraction-based metrology mode (e.g., a scatterometry-based overlay (SCOL) metrology mode). In this regard, the one or more third pattern elements 107a and 107b may be configured to include periodic and/or segmented structures for metrology using diffraction-based metrology methods (e.g., grating-over-grating structures, or any structure known in the art to be suitable for diffracting, scattering, and/or reflecting an illumination beam). By way of another example, the one or more third pattern elements 107a and 107b may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of focus-sensitive metrology target features located on different sample layers).

It is noted that the plurality of segmented third pattern elements 107a and 107b may include any one-dimensional or two-dimensional structure formed by any means known in the art, including, without limitation, one or more lithographic steps, one or more direct etching steps, or the like. The first set of third target structures 106a and 106b and/or the plurality of segmented third pattern elements 107a and 107b may be formed in any shape, including, without limitation, a square shape, a round shape, a rhombus-like shape, or a star-like shape.

It is specifically noted that the terms "previous layer" and "current layer" as used herein are not limited to one previous layer or one current layer. As used herein, the term "previous layer" is intended to refer to one or more layers of the sample formed prior to any other layer of the sample designated a "current layer" of the sample. In this way, the previous layer of the sample may comprise any one or more previous layers of the sample formed prior to the current layer of the sample. Similarly, the term "current layer" is intended to refer to one or more layers of the sample formed after the previous layer of the sample. In this way, the current layer of the sample may comprise any one or more current layers of the sample formed after the previous layer of the sample.

In some embodiments, as shown in FIG. 1B, the focus-sensitive metrology target 100 may include a second set of first target structures 108a and 108b formed on one or more layers of the sample (e.g., a current layer and/or a previous layer of the sample). The second set of first target structures 108a and 108b may include a plurality of segmented first pattern elements 103c and 103d having the first pitch, the second pitch, or the third pitch.

The plurality of segmented first pattern elements 103c and 103d may be configured for overlay measurement along at least one measurement direction (e.g., an x-direction). The plurality of segmented first pattern elements 103c and 103d may be compatible with any metrology mode known in the art to be suitable for the purposes contemplated by the present disclosure. For example, the one or more first pattern elements 103c and 103d may be compatible with a diffraction-based metrology mode (e.g., a scatterometry-based overlay (SCOL) metrology mode). In this regard, the one or more first pattern elements 103c and 103d may be configured to include periodic and/or segmented structures for metrology using diffraction-based metrology methods (e.g., grating-over-grating structures, or any structure known in the art to be suitable for diffracting, scattering, and/or reflecting an illumination beam). By way of another example, the one or more first pattern elements 103c and 103d may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of focus-sensitive metrology target features located on different sample layers).

It is noted that the plurality of segmented first pattern elements 103c and 103d may include any one-dimensional or two-dimensional structure formed by any means known in the art, including, without limitation, one or more lithographic steps, one or more direct etching steps, or the like. The second set of first target structures 108a and 108b and/or the plurality of segmented first pattern elements 103c and 103d may be formed in any shape, including, without limitation, a square shape, a round shape, a rhombus-like shape, or a star-like shape.

In some embodiments, as shown in FIG. 1B, the focus-sensitive metrology target 100 may include a second set of second target structures 110a and 110b formed on one or more layers of the sample (e.g., a current layer and/or a previous layer of the sample). The second set of second target structures 110a and 110b may include a plurality of segmented second pattern elements 105c and 105d having the first pitch, the second pitch, or the third pitch.

The plurality of segmented second pattern elements 105c and 105d may be configured for overlay measurement along at least one measurement direction (e.g., an x-direction). The plurality of segmented second pattern elements 105c and 105d may be compatible with any metrology mode known in the art to be suitable for the purposes contemplated by the present disclosure. For example, the one or more second pattern elements 105c and 105d may be compatible with a diffraction-based metrology mode (e.g., a scatterometry-based overlay (SCOL) metrology mode). In this regard, the one or more second pattern elements 105c and 105d may be configured to include periodic and/or segmented structures for metrology using diffraction-based metrology methods (e.g., grating-over-grating structures, or any structure known in the art to be suitable for diffracting, scattering, and/or reflecting an illumination beam). By way of another example, the one or more second pattern elements 105c and 105d may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of focus-sensitive metrology target features located on different sample layers).

It is noted that the plurality of segmented second pattern elements 105c and 105d may include any one-dimensional or two-dimensional structure formed by any means known in the art, including, without limitation, one or more lithographic steps, one or more direct etching steps, or the like. The second set of second target structures 110a and 110b and/or the plurality of segmented second pattern elements 105c and 105d may be formed in any shape, including, without limitation, a square shape, a round shape, a rhombus-like shape, or a star-like shape.

In some embodiments, as shown in FIG. 1B, the focus-sensitive metrology target 100 may include a second set of third target structures 112a and 112b formed on one or more layers of the sample (e.g., a current layer and/or a previous layer of the sample). The second set of third target structures 112a and 112b may include a plurality of segmented third pattern elements 107c and 107d having the first pitch, the second pitch, or the third pitch.

The plurality of segmented third pattern elements 107c and 107d may be configured for overlay measurement along at least one measurement direction (e.g., an x-direction). The plurality of segmented third pattern elements 107c and 107d may be compatible with any metrology mode known in the art to be suitable for the purposes contemplated by the present disclosure. For example, the one or more third pattern elements 107c and 107d may be compatible with a diffraction-based metrology mode (e.g., a scatterometry-based overlay (SCOL) metrology mode). In this regard, the one or more third pattern elements 107c and 107d may be configured to include periodic and/or segmented structures for metrology using diffraction-based metrology methods (e.g., grating-over-grating structures, or any structure known in the art to be suitable for diffracting, scattering, and/or reflecting an illumination beam). By way of another example, the one or more third pattern elements 107c and 107d may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of focus-sensitive metrology target features located on different sample layers).

It is noted that the plurality of segmented third pattern elements 107c and 107d may include any one-dimensional or two-dimensional structure formed by any means known in the art, including, without limitation, one or more lithographic steps, one or more direct etching steps, or the like. The second set of third target structures 112a and 112b and/or the plurality of segmented third pattern elements 107c and 107d may be formed in any shape, including, without limitation, a square shape, a round shape, a rhombus-like shape, or a star-like shape.

In some embodiments, as shown in FIG. 1B, the first set of first target structures 102a and 102b may be rotationally symmetric to the second set of first target structures 108a and 108b about a center of symmetry 114. For example, the first set of first target structures 102a and 102b may be four-fold rotationally symmetric to the second set of first target structures 108a and 108b about the center of symmetry 114.

In some embodiments, as shown in FIG. 1B, the first set of second target structures 104a and 104b may be rotationally symmetric to the second set of second target structures 110a and 110b about the center of symmetry 114. For example, the first set of second target structures 104a and 104b may be four-fold rotationally symmetric to the second set of second target structures 110a and 110b about the center of symmetry 114.

In some embodiments, as shown in FIG. 1B, the first set of third target structures 106a and 106b may be rotationally symmetric to the second set of third target structures 112a and 112b about the center of symmetry 114. For example, the first set of third target structures 106a and 106b may be four-fold rotationally symmetric to the second set of third target structures 112a and 112b about the center of symmetry 114.

It is noted that the embodiments of the present disclosure are not limited to those embodiments including rotational symmetry. For example, with respect to two or more layers of the sample, the embodiments of the present disclosure may not display rotational symmetry when an overlay error exists between the two or more layers.

It is contemplated that the focus-sensitive metrology target 100 is not limited to embodiments having a second set of first target structures 108a and 108b, a second set of second target structures 110a and 110b, and/or a second set of third target structures 112a and 112b. For example, in some embodiments, as shown in FIG. 1A, the focus-sensitive metrology target 100 may include only the first set of first target structures 102a and 102b and the first set of second target structures 104a and 104b.

Figure 1C:
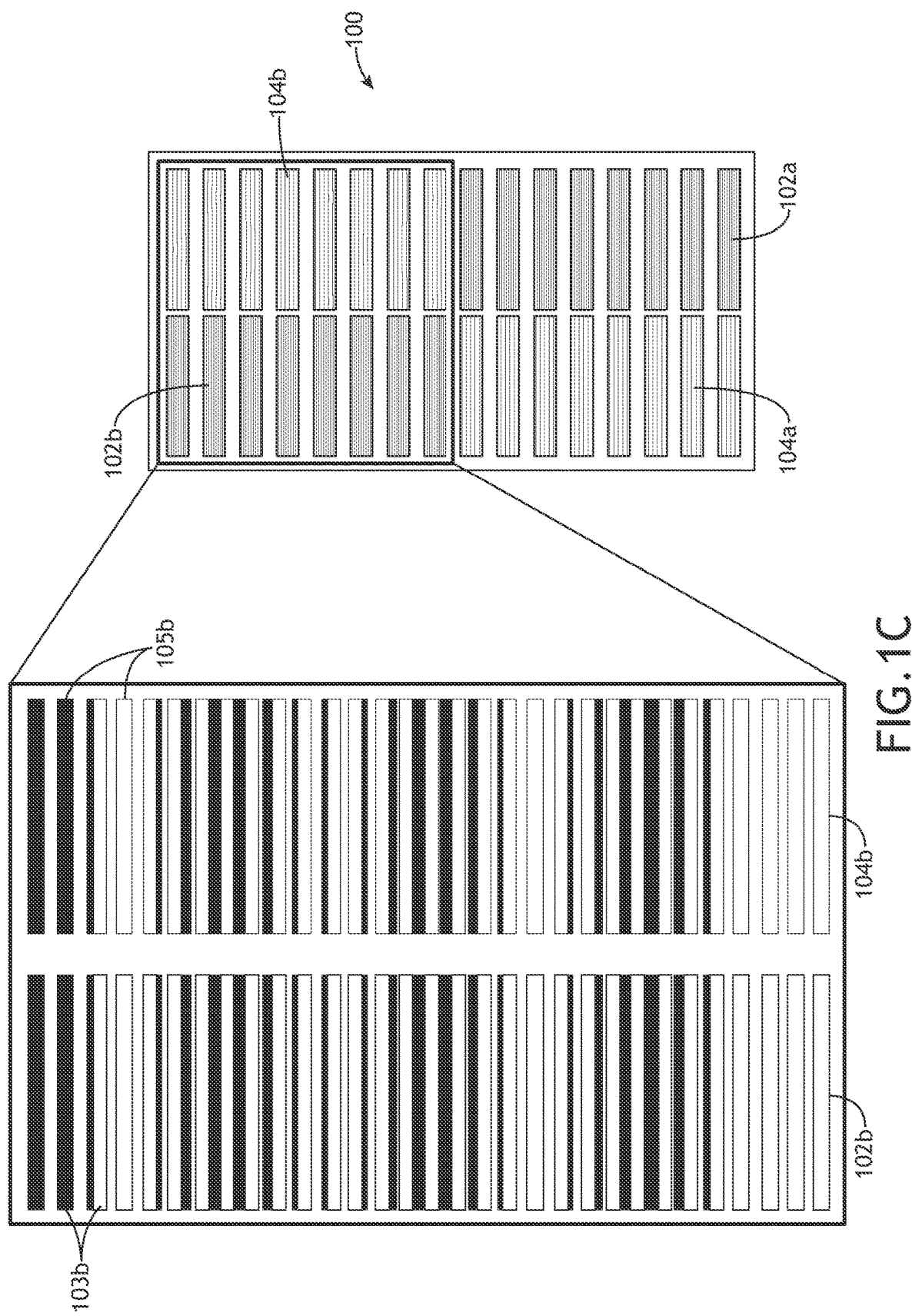
FIG. 1C is a top view of a focus-sensitive metrology target, in accordance with one or more embodiments of the present disclosure.

In some embodiments, as shown in FIG. 1C, the plurality of segmented first pattern elements 103a and 103b and the plurality of segmented second pattern elements 105a and 105b may be configured to increase focus and/or metrology measurement sensitivity and to include a greater focus response than other metrology targets (e.g., single layer metrology targets. For example, the plurality of segmented first pattern elements 103a and 103b and the plurality of segmented second pattern elements 105a and 105b may each include a Moiré pattern formed along a direction (e.g., a y-direction) from overlapping periodic structures formed on different layers of the sample. By way of another example, each of the plurality of segmented first pattern elements 103a and 103b and the plurality of segmented second pattern elements 105a and 105b may include two or more overlapping periodic structures, where each of the overlapping periodic structures is formed on a different layer of the sample. The periodicity of each the overlapping periodic structures may be of a period (e.g., a distance of separation between repeated elements of the overlapping periodic structure) between approximately 300 nanometers and approximately 700 nanometers, and the period of each of the overlapping periodic structures may be of a different value within the range of approximately 300 nanometers and approximately 700 nanometers. For example, one overlapping periodic structure may have a period of approximately 420 nanometers, while another overlapping periodic structure may have a period of approximately 480 nanometers. In this way, the overlapping periodic structures may be configured to produce a Moiré effect when illuminated and/or imaged in such a way that measurement accuracy (e.g., metrology measurement and/or focus measurement) is increased. By way of another example, the overlapping periodic structures may be configured to produce a Moiré grating-over-grating effect, such as a double scattering Moiré effect (e.g., collecting 0-order diffraction and at least one Moiré diffraction order), or a method of measuring overlay using a single scattering optical Moiré effect (a Moiré effect that appears on a camera due to the interference between single scattering effects, e.g., collecting 1st-order diffraction and filtering an image to isolate Moiré interference). The use of Moiré patterns in overlay metrology is generally described in U.S. Pat. No. 7,440,105, issued on Oct. 21, 2008, U.S. Pat. No. 7,349,105, issued on Mar. 25, 2008, and U.S. Patent App. Publ. No. 2018/0188663, published on Jul. 5, 2018, each of which is incorporated herein in the entirety. It is noted that the embodiments of the present disclosure are not limited to the plurality of segmented first pattern elements 103a and 103b and the plurality of segmented second pattern elements 105a and 105b having a Moiré pattern. For example, the plurality of segmented third pattern elements 107a and 107b may include a Moiré pattern.

Figure 1D:
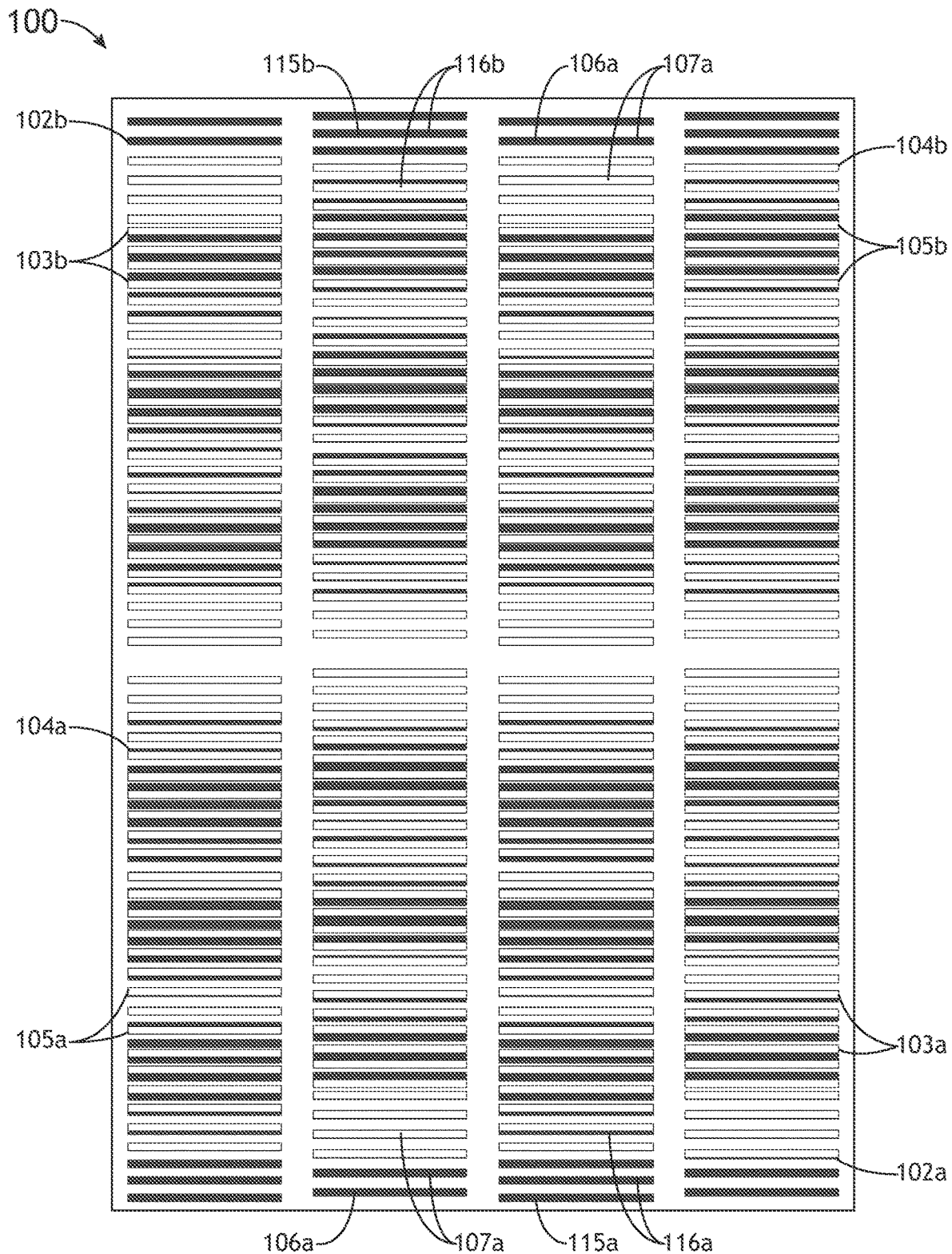
FIG. 1D is a top view of a focus-sensitive metrology target, in accordance with one or more embodiments of the present disclosure.

In some embodiments, as shown in FIG. 1D, the focus-sensitive metrology target 100 may include a first set of fourth target structures 115a and 115b formed on one or more layers of the sample (e.g., a current layer and/or a previous layer of the sample). The first set of fourth target structures 115a and 115b may include a plurality of segmented fourth pattern elements 116a and 116b having a Moiré pattern.

The plurality of segmented fourth pattern elements 116a and 116b may be configured for overlay measurement along at least one measurement direction (e.g., a y-direction). The plurality of segmented fourth pattern elements 116a and 116b may be compatible with any metrology mode known in the art to be suitable for the purposes contemplated by the present disclosure. For example, the one or more fourth pattern elements 116a and 116b may be compatible with a diffraction-based metrology mode (e.g., a scatterometry-based overlay (SCOL) metrology mode). In this regard, the one or more fourth pattern elements 116a and 116b may be configured to include periodic and/or segmented structures for metrology using diffraction-based metrology methods (e.g., grating-over-grating structures, or any structure known in the art to be suitable for diffracting, scattering, and/or reflecting an illumination beam). By way of another example, the one or more fourth pattern elements 116a and 116b may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of focus-sensitive metrology target 100 features located on different sample layers).

It is noted that the plurality of segmented fourth pattern elements 116a and 116b may include any one-dimensional or two-dimensional structure formed by any means known in the art, including, without limitation, one or more lithographic steps, one or more direct etching steps, or the like. The first set of fourth target structures 115a and 115b and/or the plurality of segmented fourth pattern elements 116a and 116b may be formed in any shape, including, without limitation, a square shape, a round shape, a rhombus-like shape, or a star-like shape.

It is further noted that the first set of fourth target structures 115a and 115b may allow the focus-sensitive metrology target 100 to be used for more accurate overlay metrology measurements. For example, the inclusion of the first set of fourth target structures 115a and 115b with the first set of first target structures 102a and 102b, the first set of second target structures 104a and 104b, and/or the first set of third target structures 106a and 106b may allow for additional metrology measurements based on one or more signals emanating from the first set of first target structures 102a and 102b, the first set of second target structures 104a and 104b, the first set of third target structures 106a and/or the first set of fourth target structures 115a and 115b.

Figure 2:
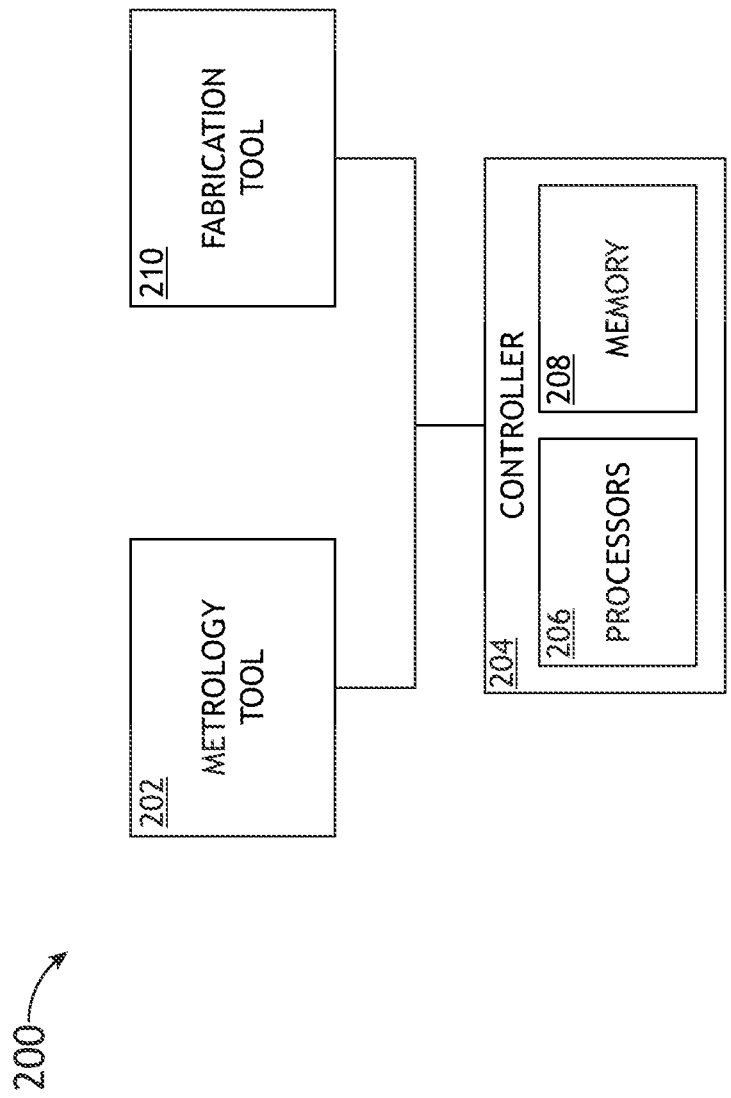
FIG. 2 is a conceptual view of one or more portions of a focus control system, in accordance with one or more embodiments of the present disclosure.

FIG. 2 illustrates a simplified block diagram of a focus control system 200, in accordance with one or more embodiments of the present disclosure. In one embodiment, the focus control system 200 includes one or more fabrication tools 210. The one or more fabrication tools 210 may include any tool configured to form an overlay metrology target, including, without limitation, any lithographic tool, any EUV scanner, or the like.

In some embodiments, the focus control system 200 includes one or more metrology tools 202. The one or more metrology tools 202 may be configured to operate in either an imaging mode or a non-imaging mode. For example, in an imaging mode, individual focus-sensitive metrology target 100 elements may be resolvable within the illuminated spot on the sample (e.g., as part of a bright-field image, a dark-field image, a phase-contrast image, or the like). By way of another example, the one or more metrology tools 202 may operate as a scatterometry-based overlay (SCOL) metrology tool in which radiation from the sample is analyzed at a pupil plane to characterize the angular distribution of radiation from the sample (e.g., associated with scattering and/or diffraction of radiation by the sample).

The one or more metrology tools 202 may direct illumination to a sample and may further collect radiation emanating from the sample to generate an overlay signal suitable for the determination of overlay of two or more sample layers. The one or more metrology tools 202 may include any type of overlay metrology tool known in the art suitable for generating overlay signals suitable for determining overlay associated with metrology targets on a sample, including, without limitation, any optical metrology tool (e.g., an advanced imaging metrology (AIM) tool, an advanced imaging metrology in-die (AIMid) tool, a triple advanced imaging metrology (Triple AIM) tool, Archer, and the like), any particle-based metrology tool (e.g., an electron-beam metrology tool), or a scatterometry-based overlay (SCOL) metrology tool.

The one or more metrology tools 202 may be configurable to generate overlay signals based on any number of recipes defining measurement parameters for acquiring an overlay signal suitable for determining overlay of a focus-sensitive metrology target 100. For example, a recipe of the one or more metrology tools 202 may include, but is not limited to, an illumination wavelength, a detected wavelength of radiation emanating from the sample, a spot size of illumination on the sample, an angle of incident illumination, a polarization of incident illumination, wave plan of the incident beam, a position of a beam of incident illumination on an focus-sensitive metrology target, a position of an focus-sensitive metrology target in the focal volume of the overlay metrology tool, or the like.

In another embodiment, the focus control system 200 includes a controller 204 communicatively coupled to the one or more fabrication tools 210 and/or the one or more metrology tools 202. The controller 204 may be configured to direct the one or more fabrication tools 210 to perform one or more steps in the fabrication of a focus-sensitive metrology target 100. The controller 204 may be configured to direct the one or more metrology tools 202 to generate overlay signals based on one or more selected recipes. The controller 204 may be further configured to receive data including, but not limited to, overlay signals (e.g., signals indicative of illumination emanating from one or more focus-sensitive metrology targets) from the one or more metrology tools 202. Additionally, the controller 204 may be configured to determine one or more focus-offset values based on the one or more signals indicative of illumination emanating from the one or more focus-sensitive metrology targets 100. In some embodiments, the controller 204 may be configured to determine overlay associated with a focus-sensitive metrology target 100 based on the acquired overlay signals.

In another embodiment, the controller 204 includes one or more processors 206. For example, the one or more processors 206 may be configured to execute a set of program instructions maintained in a memory medium 208, or memory. The controller 204 may be configured to determine an overlay error of a sample having one or more metrology targets 100 based on one or more overlay measurements of the sample. For example, in one embodiment, the metrology sub-system 202 may direct illumination to a sample having one or more metrology targets 100. In another embodiment, the metrology sub-system 202 may be configured to further collect radiation emanating from the sample to generate one or more overlay measurements (or one or more signals indicative of one or more overlay measurements) suitable for the determination of overlay of two or more sample layers. In another embodiment, the controller 204 may be configured to determine one or more focus-offset values based on the one or more signals indicative of illumination emanating from the sample.

In one embodiment, the controller 204 may be configured to determine one or more focus-offset values of the sample based on signals indicative of illumination emanating from the first set of first target structures 102a and 102b, the second set of first target structures 108a and 108b, the first set of second target structures 104a and 104b, the second set of second target structures 110a and 110b, the first set of third target structures 106a and 106b, the second set of third target structures 112a and 112b, and/or the first set of fourth target structures 115a and 115b. For example, the controller 204 may be configured to generate one or more focus off-set values by comparing the signals indicative of illumination emanating from the first set of first target structures 102a and 102b, the second set of first target structures 108a and 108b, the first set of second target structures 104a and 104b, the second set of second target structures 110a and 110b, the first set of third target structures 106a and 106b, the second set of third target structures 112a and 112b, and/or the first set of fourth target structures 115a and 115b to a pre-determined calibration function stored in memory 208. The pre-determined calibration function maybe constructed either through simulation or by a dedicated focus-sensitivity experiment. By way of another example, the pre-determined calibration function may be generated by performing a plurality of measurements at varying but known levels of focus. As an additional example, the pre-determined calibration function may include any simulation and/or function that may predict an actual focus of approximately one nanometer over a focus range, including, without limitation, one or more Prolith simulations. In another embodiment, the controller 204 may be configured to determine one or more focus-offset values of the sample based on signals indicative of illumination emanating from the first set of first target structures 102a and 102b, the second set of first target structures 108a and 108b, the first set of second target structures 104a and 104b, the second set of second target structures 110a and 110b, the first set of third target structures 106a and 106b, the second set of third target structures 112a and 112b, and/or the first set of fourth target structures 115a and 115b. For example, the controller 204 may be configured to generate one or more focus off-set values by comparing the signals indicative of illumination emanating from the first set of first target structures 102a and 102b, the second set of first target structures 108a and 108b, the first set of second target structures 104a and 104b, the second set of second target structures 110a and 110b, the first set of third target structures 106a and 106b, the second set of third target structures 112a and 112b, and/or the first set of fourth target structures 115a and 115b to a pre-determined calibration function stored in memory 208.

In another embodiment, the controller 204 may be configured to determine an overlay error of a sample having one or more metrology targets 100 based on one or more overlay measurements of the sample. For example, the controller 204 may be configured to generate one or more overlay measurements of the sample based on one or more signals indicative of illumination emanating from one or more portions of the sample (e.g., the first set of first target structures 102a and 102b, the second set of first target structures 108a and 108b, the first set of second target structures 104a and 104b, the second set of second target structures 110a and 110b, the first set of third target structures 106a and 106b, the second set of third target structures 112a and 112b, and/or the first set of fourth target structures 115a and 115b). The one or more overlay measurements of the sample may correspond to an overlay position of one or more layers of the sample. The controller 204 may be configured to generate one or more corrected overlay measurements by correcting one or more uncorrected overlay measurements (e.g., overlay measurements taken without regard to proper and/or desired focus) using the one or more focus-offset values. In this regard, the controller 204 may be configured to provide one or more focus corrections determined based on the one or more focus-offset values to one or more portions of the one or more metrology tools 202.

It is noted herein that the embodiments of the present disclosure, including, without limitation, those embodiments of the focus-sensitive metrology target 100 configured for focus correction and overlay metrology, are configured to increase the efficiency of overlay metrology measurements and to decrease measurement cycle time. For example, in some embodiments, the focus-sensitive metrology target 100 may be configured to simultaneously (or nearly-simultaneously) correct a focus of one or more components of the one or more portions of the focus control system 200 and generate one or more metrology measurements at a desired focus.

The one or more processors 206 of the controller 204 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 206 may include any device configured to execute algorithms and/or instructions (e.g., program instructions stored in memory). In one embodiment, the one or more processors 206 may be embodied as a desktop computer, mainframe computer system, workstation, image computer, parallel processor, networked computer, or any other computer system configured to execute a program configured to operate or operate in conjunction with the metrology system 300, as described throughout the present disclosure. Further, the steps described throughout the present disclosure may be carried out by a single controller 204 or, alternatively, multiple controllers. Additionally, the controller 204 may include one or more controllers housed in a common housing or within multiple housings. In this way, any controller or combination of controllers may be separately packaged as a module suitable for integration into metrology system 300. Further, the controller 204 may analyze data received from the one or more metrology tools 202 and/or the one or more fabrication tools 210 and feed the data to additional components within the focus control system 200 or external to the focus control system 200.

The memory medium 208 may include any storage medium known in the art suitable for storing program instructions executable by the associated one or more processors 206. For example, the memory medium 208 may include a non-transitory memory medium. By way of another example, the memory medium 208 may include, but is not limited to, a read-only memory (ROM), a random-access memory (RAM), a magnetic or optical memory device (e.g., disk), a magnetic tape, a solid-state drive and the like. It is further noted that memory medium 208 may be housed in a common controller housing with the one or more processors 206. In one embodiment, the memory medium 208 may be located remotely with respect to the physical location of the one or more processors 206 and controller 204. For instance, the one or more processors 206 of controller 204 may access a remote memory (e.g., server), accessible through a network (e.g., internet, intranet and the like).

In one embodiment, a user interface (not shown) may be communicatively coupled to the controller 204. The user interface may include, but is not limited to, one or more desktops, laptops, tablets, and the like. In another embodiment, the user interface includes a display used to display data of the focus control system 200 to a user. The display of the user interface may include any display known in the art. For example, the display may include, but is not limited to, a liquid crystal display (LCD), an organic light-emitting diode (OLED) based display, or a CRT display. Those skilled in the art should recognize that any display device capable of integration with a user interface is suitable for implementation in the present disclosure. In another embodiment, a user may input selections and/or instructions responsive to data displayed to the user via a user input device of the user interface.

Figure 3:
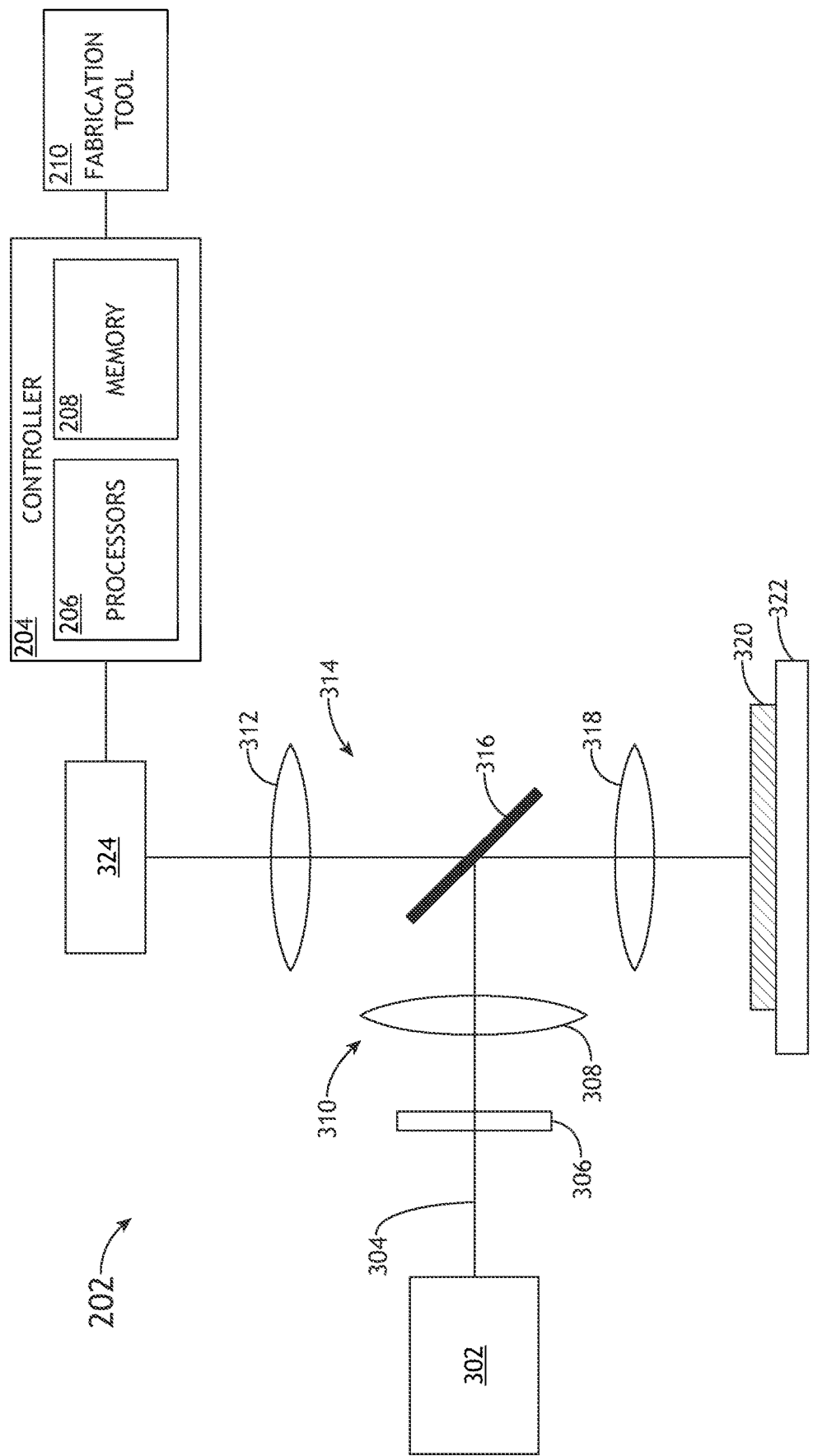
FIG. 3 is a schematic view of focus control system, in accordance with one or more embodiments of the present disclosure.

In one embodiment, as shown in FIG. 3, the focus control system 200 may include one or more metrology tools 202. In some embodiments, the one or more metrology tools 202 may include an optical metrology tool, including, without limitation, an optical metrology tool configured to generate and/or detect an optical illumination beam having x-ray, ultraviolet (UV), infrared (IR), or visible light wavelengths. By way of another example, the one or more metrology tools 202 may include an advanced imaging metrology (AIM) tool, an advanced imaging metrology in-die (AIMid) tool, or a triple advanced imaging metrology (Triple AIM) tool.

In one embodiment, the one or more metrology tools 202 may include an optical illumination source 302 configured to generate an optical illumination beam 304. The optical illumination beam 304 may include one or more selected wavelengths of radiation including, but not limited to, x-ray, ultraviolet (UV) light, visible light, or infrared (IR) light.

The optical illumination source 302 may include any type of illumination source suitable for providing an optical illumination beam 304. In one embodiment, the optical illumination source 302 is a laser source. For example, the optical illumination source 302 may include, but is not limited to, one or more narrowband laser sources, a broadband laser source, a supercontinuum laser source, a white light laser source, or the like. In this regard, the optical illumination source 302 may provide an optical illumination beam 304 having high coherence (e.g., high spatial coherence and/or temporal coherence). In another embodiment, the optical illumination source 302 includes a laser-sustained plasma (LSP) source. For example, the optical illumination source 302 may include, but is not limited to, a LSP lamp, a LSP bulb, or a LSP chamber suitable for containing one or more elements that, when excited by a laser source into a plasma state, may emit broadband illumination. In another embodiment, the optical illumination source 302 includes a lamp source. For example, the optical illumination source 302 may include, but is not limited to, an arc lamp, a discharge lamp, an electrode-less lamp, or the like. In this regard, the optical illumination source 302 may provide an optical illumination beam 304 having low coherence (e.g., low spatial coherence and/or temporal coherence).

In another embodiment, the optical illumination source 302 directs the optical illumination beam 304 to the sample 320 via an illumination pathway 310. The illumination pathway 310 may include one or more illumination pathway lenses 308 or additional optical components 306 suitable for modifying and/or conditioning the optical illumination beam 304. For example, the one or more optical components 306 may include, but are not limited to, one or more polarizers, one or more filters, one or more beam splitters, one or more diffusers, one or more homogenizers, one or more apodizers, or one or more beam shapers. The illumination pathway 310 may further include an objective lens 316 configured to direct the optical illumination beam 304 to the sample 320.

In another embodiment, the sample 320 is disposed on a sample stage 322. The sample stage 322 may include any device suitable for positioning and/or scanning the sample 320 within the one or more metrology tools 202. For example, the sample stage 322 may include any combination of linear translation stages, rotational stages, tip/tilt stages, or the like.

In another embodiment, the one or more metrology tools 202 include one or more detectors 324 configured to capture light emanating from the sample 320 through a collection pathway 314. The collection pathway 314 may include, but is not limited to, one or more collection pathway lenses 312, 318 for collecting light from the sample 320. For example, the one or more detectors 324 may receive light reflected or scattered (e.g., via specular reflection, diffuse reflection, and the like) from the sample 320 via one or more collection pathway lenses 312, 318. By way of another example, the one or more detectors 324 may receive light generated by the sample 320 (e.g., luminescence associated with absorption of the optical illumination beam 304, or the like). By way of another example, the one or more detectors 324 may receive one or more diffracted orders of light from the sample 320 (e.g., 0-order diffraction, +1 order diffraction, +2 order diffraction, and the like).

The one or more detectors 324 may include any type of detector known in the art suitable for measuring illumination received from the sample 320. For example, a detector 324 may include, but is not limited to, a CCD detector, a TDI detector, a photomultiplier tube (PMT), an avalanche photodiode (APD), a complementary metal-oxide-semiconductor (CMOS) sensor, or the like. In another embodiment, a detector 324 may include a spectroscopic detector suitable for identifying wavelengths of light emanating from the sample 320.

In one embodiment, the one or more detectors 324 are positioned approximately normal to the surface of the sample 320. In another embodiment, the one or more metrology tools 202 includes a beamsplitter oriented such that the objective lens 316 may simultaneously direct the optical illumination beam 304 to the sample 320 and collect light emanating from the sample 320. Further, the illumination pathway 310 and the collection pathway 314 may share one or more additional elements (e.g., objective lens 316, apertures, filters, or the like).

It is to be understood that the description of the one or more metrology tools 202, as depicted in FIG. 3, and the associated descriptions above, are provided solely for illustrative purposes and should not be interpreted as limiting. For example, the one or more metrology tools 202 may include a multi-beam and/or a multi-column system suitable for simultaneously interrogating a sample 320. In a further embodiment, one or more metrology tools 202 may include one or more components (e.g., one or more electrodes) configured to apply one or more voltages to one or more locations of the sample 320. In this regard, the one or more metrology tools 202 may generate voltage contrast imaging data.

As previously described, the focus control system 200 may include a controller 204 communicatively coupled to the one or more metrology tools 202 and/or the one or more fabrication tools 210. The controller 204 may be configured to direct the one or more metrology tools 202 to generate overlay signals based on one or more selected recipes. The controller 204 may be further configured to receive data including, but not limited to, overlay signals from the one or more metrology tools 202 and/or the one or more fabrication tools 210. Additionally, the controller 204 may be configured to determine overlay associated with an focus-sensitive metrology target based on the acquired overlay signals. For example, the controller 204 may be configured to generate one or more overlay measurements of the sample based on one or more signals indicative of illumination emanating from one or more portions of the sample (e.g., the first set of first target structures 102a and 102b, the second set of first target structures 108a and 108b, the first set of second target structures 104a and 104b, the second set of second target structures 110a and 110b, the first set of third target structures 106a and 106b, the second set of third target structures 112a and 112b, and/or the first set of fourth target structures 115a and 115b). The one or more overlay measurements of the sample may correspond to an overlay position of one or more layers of the sample. The controller 204 may be configured to generate one or more corrected overlay measurements by correcting one or more uncorrected overlay measurements (e.g., overlay measurements taken without regard to proper and/or desired focus) using the one or more focus-offset values. In this regard, the controller 204 may be configured to provide one or more focus corrections determined based on the one or more focus-offset values to one or more portions of the focus control system 200.

Figure 4:
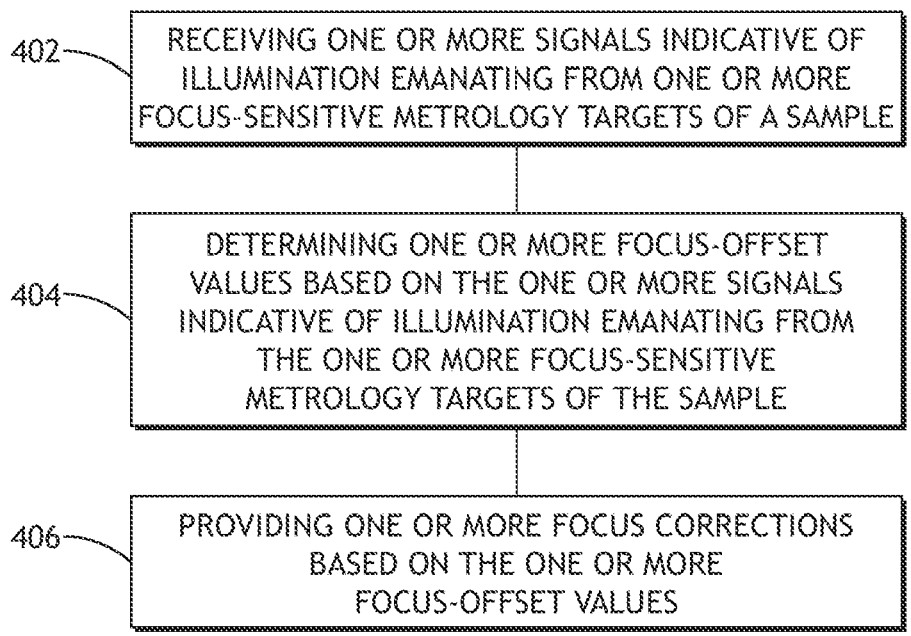
FIG. 4 is a process flow diagram depicting the steps of a method of focus control, in accordance with one or more embodiments of the present disclosure.

FIG. 4 illustrates a process flow diagram depicting the steps of a method 400 of focus control, in accordance with one or more embodiments of the present disclosure.

In Step 402, one or more signals indicative of illumination emanating from one or more focus-sensitive metrology targets 100 of a sample are received. For example, a sample including one or more focus-sensitive metrology targets 100 may be illuminated with an illumination beam, and a reflected beam may emanate from the one or more metrology targets 100 and may be detected by one or more portions of the focus control system 200. As used herein, the term "illumination beam" may refer to any radiant beam, including, without limitation, the illumination beam 304, and the term "reflected beam" may refer to the reflected beam 308.

In Step 404, one or more focus-offset values are determined based on the one or more signals indicative of illumination emanating from the one or more focus-sensitive metrology targets 100. For example, the controller 204 may be configured to determine one or more focus-offset values of the sample based on signals indicative of illumination emanating from the first set of first target structures 102a and 102b, the second set of first target structures 108a and 108b, the first set of second target structures 104a and 104b, the second set of second target structures 110a and 110b, the first set of third target structures 106a and 106b, the second set of third target structures 112a and 112b, and/or the first set of fourth target structures 115a and 115b. By way of another example, the controller 204 may be configured to generate one or more focus off-set values by comparing the signals indicative of illumination emanating from the first set of first target structures 102a and 102b, the second set of first target structures 108a and 108b, the first set of second target structures 104a and 104b, the second set of second target structures 110a and 110b, the first set of third target structures 106a and 106b, the second set of third target structures 112a and 112b, and/or the first set of fourth target structures 115a and 115b, to a pre-determined calibration function stored in memory 208. The pre-determined calibration function maybe constructed either through simulation or by a dedicated focus-sensitivity experiment. For example, the pre-determined calibration function may be generated by performing a plurality of metrology measurements at varying but known levels of focus. In another embodiment, the controller 204 may be configured to determine one or more focus-offset values of the sample based on signals indicative of illumination emanating from the first set of first target structures 102a and 102b, the second set of first target structures 108a and 108b, the first set of second target structures 104a and 104b, the second set of second target structures 110a and 110b, the first set of third target structures 106a and 106b, the second set of third target structures 112a and 112b, and/or the first set of fourth target structures 115a and 115b.

In Step 406, one or more focus corrections are provided based on the one or more focus-offsets determined in at least Step 404. For example, Step 406 may include the controller 204 generating one or more control signals (or corrections to the control signals) for adjusting one or more parameters (e.g., fabrication settings, configuration, and the like) of one or more fabrication tools (e.g., lithographic tools, EUV scanner, or the like). The control signals (or corrections to the control signals) may be provided by the controller 204 as part of a feedback and/or feedforward control loop. The controller 204 may cause the one or more fabrication tools to execute one or more adjustments to the one or more parameters of the one or more process tools based on the one or more control signals (or corrections to the control signals). In some embodiments, the controller 204 may alert a user to make the one or more adjustments. In this sense, the one or more control signals may compensate for errors of one or more fabrication processes of the one or more fabrication tools, and thus may enable the one or more fabrication tools to maintain overlay within selected tolerances across multiple exposures on subsequent samples in the same or different lots.

Figure 5:
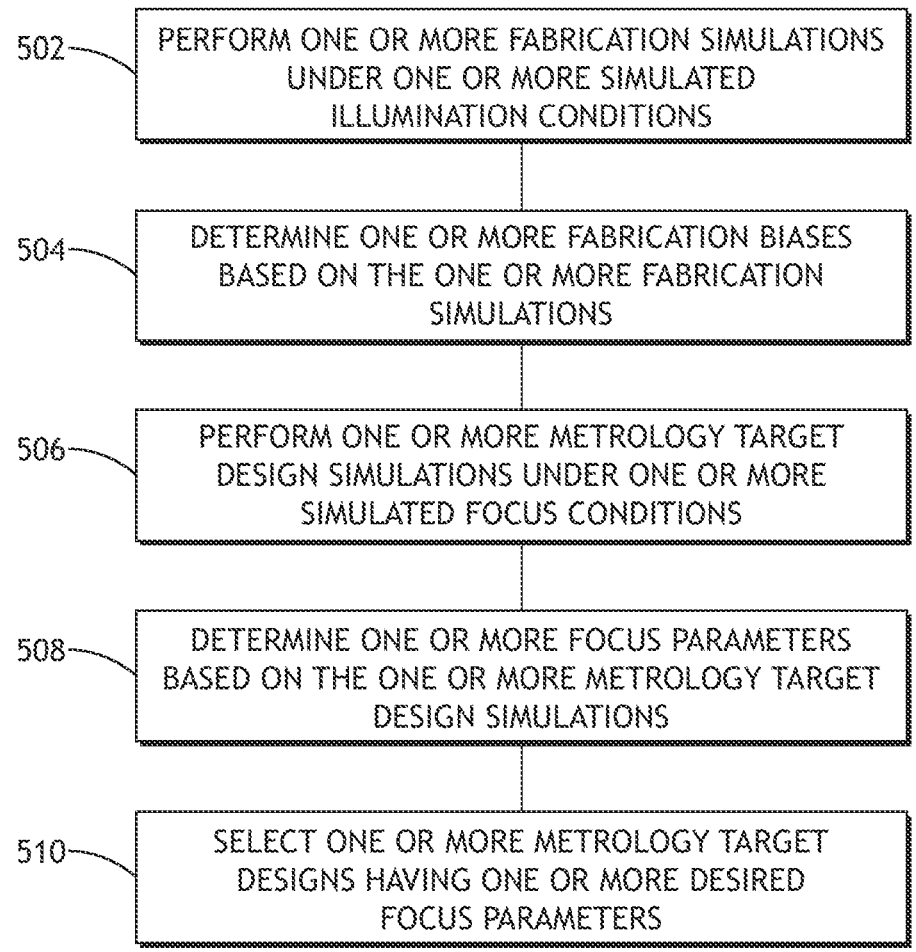
FIG. 5 is a process flow diagram depicting the steps of a method of selecting one or more metrology target designs as part of a focus control method, in accordance with one or more embodiments of the present disclosure.

FIG. 5 illustrates a process flow diagram depicting the steps of a method 500 of selecting one or more metrology target designs as part of a focus control method, in accordance with one or more embodiments of the present disclosure. It is noted that any one or more of the steps of method 500, or the method 500 as a whole, may be performed as one or more sub-steps of any step of any of the methods disclosed herein, including, without limitation, as one or more sub-steps of the method 400.

In Step 502, one or more fabrication simulations are performed under one or more simulated illumination conditions. For example, the one or more fabrication simulations (e.g., lithography simulations) may include one or more Prolith simulations. The one or more simulated illumination conditions may include conditions that may correspond and/or contribute to the existence of one or more biases (e.g., critical dimension bias) with respect to the fabrication of one or more portions of one or more metrology targets (e.g., outer lines, spaces, patterns, or the like) fabricated on a sample. For example, the one or more simulated illumination conditions may include variations in a quantity of lines, spaces, and/or segments of one or more patterns typically fabricated on the sample. It is noted that the one or more fabrication simulations may be carried out in a virtual space, and that the one or more fabrication simulations may be configured to produce results indicative of results that would be expected in a real-world fabrication context. In some embodiments, the one or more fabrication simulations may be carried out using a simulated, simplified metrology target. For example, the one or more fabrication simulations may be carried out using a simulated metrology target that contains fewer features (e.g., a segmented coarse bar having relatively small dimensions) but that is representative of a given metrology target of interest (e.g., that contains a pitch representative of a metrology target of interest). It is noted that use of the simulated, simplified metrology target may serve to decrease the amount of time required to perform the one or more fabrication simulations.

In Step 504, one or more fabrication biases are determined based on the one or more fabrication simulations. For example, the one or more fabrication simulations may be performed such that one or more simulated biases and/or pattern placement errors may be determined. In this regard, the one or more fabrication simulations may be predictive of fabrication errors that may occur during a fabrication process of a particular metrology target of interest.

In Step 506, one or more metrology target design simulations are performed under one or more simulated focus conditions. For example, one or more simulations may be performed using one or more selected metrology target designs of interest. By way of another example, the one or more metrology target design simulations may be performed using one or more metrology target designs having wafer stack designs similar to a selected metrology target design of interest. The one or more metrology target design simulations may be performed under one or more simulated focus conditions. For example, the one or more simulated focus conditions may include illumination settings of one or more metrology tools, such as wavelength, polarization, or bandwidth. It is noted that the one or more metrology target design simulations may be carried out in a virtual space, and that the one or more metrology target design simulations may be configured to produce results indicative of results that would be expected in a real-world metrology context.

In Step 508, one or more focus-sensitive metrology parameters are determined based on the one or more metrology target design simulations. For example, the effect of varying metrology target designs (e.g., segmentation pitch) on one or more aspects of focus measurement and/or overlay metrology may be determined.

In Step 510, one or more metrology target designs having one or more focus-sensitive metrology parameters are selected. For example, one or more metrology target designs having a desired focus-sensitivity parameter (e.g., through-focus response) may be selected. By way of another example, a metrology target design having target features formed on a plurality of layers of the sample, where one or more focus-sensitivity parameters (e.g., a relative difference in the through-focus response of the target features formed on a plurality of layers of the sample) are desired, may be selected.

Figure 6:
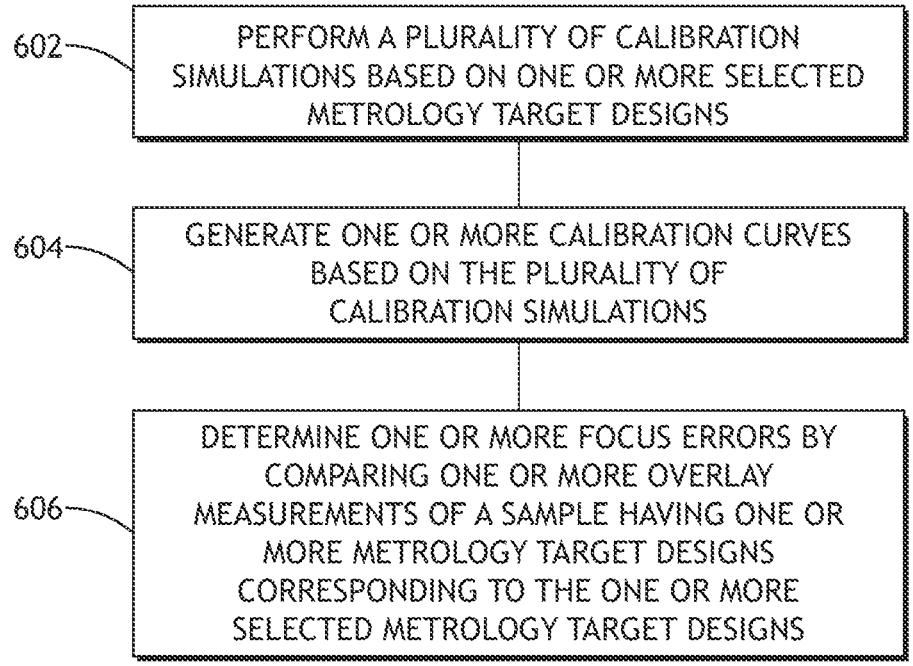
FIG. 6 is a process flow diagram depicting the steps of a method of determining one or more focus errors as part of a focus control method, in accordance with one or more embodiments of the present disclosure.

FIG. 6 illustrates a process flow diagram depicting the steps of a method 600 determining one or more focus errors as part of a focus control method, in accordance with one or more embodiments of the present disclosure. It is noted that any one or more of the steps of method 600, or the method 600 as a whole, may be performed as one or more sub-steps of any step of any of the methods disclosed herein, including, without limitation, as one or more sub-steps of the method 400.

In Step 602, a plurality of calibration simulations based on one or more selected metrology target designs may be performed. For example, a plurality of fabrication simulations and/or a plurality of metrology target design simulations may be performed on a selected metrology target design (e.g., a metrology target design of interest and for which focus errors will be determined) such that a plurality of fabrication biases and/or a plurality of focus parameters for varying illumination conditions and/or focus conditions may be determined for the selected metrology target design.

In Step 604, one or more calibration curves may be generated based on the plurality of calibration simulations. For example, one or more calibration curves may be generated, where one or more values corresponding to the illumination conditions and/or focus conditions may be plotted against one or more values corresponding to a range of fabrication biases and/or focus parameters. In this regard, the one or more calibration curves may be used to determine a focus error resulting from at least one of the illumination conditions or the focus conditions by comparing one or more overlay measurements generated based on the selected metrology target design (such as the overlay measurements generated in method 700 described herein) to the one or more calibration curves.

In Step 606, one or more focus errors are determined by comparing one or more overlay measurements of a sample having one or more metrology target designs corresponding to the one or more selected target metrology designs. For example, the one or more overlay measurements of the sample may be compared to the one or more calibration curves, based on one or more illumination conditions and/or focus conditions existing during the generation of the one or more overlay measurements. In this regard, the one or more overlay measurements may be translated to one or more signals indicative of one or more focus errors that may exist within a fabrication process. In some embodiments, one or more focus corrections may be provided based on the one or more focus errors. For example, one or more control signals (or corrections to the control signals) may be generated to adjust one or more parameters (e.g., fabrication conditions, illumination conditions, fabrication tool configuration, and the like) of one or more fabrication tools (e.g., lithographic tools, EUV scanner, or the like). The control signals (or corrections to the control signals) may be provided (e.g., by the controller 204) as part of a feedback and/or feedforward control loop. The controller 204 may cause the one or more process tools to execute one or more adjustments to the one or more parameters of the one or more fabrication tools based on the one or more control signals (or corrections to the control signals). In some embodiments, the controller 204 may alert a user to make the one or more adjustments. In this sense, the one or more control signals may compensate for errors of one or more fabrication processes of the one or more process tools, and thus may enable the one or more process tools to maintain overlay within selected tolerances across multiple exposures on subsequent samples in the same or different lots.

It is noted that, in some embodiments, one or more focus errors may be determined in Step 606 by generating a machine learning classifier and providing one or more overlay measurements to the machine learning classifier, where the machine learning classifier is configured to determine one or more focus errors. The machine learning classifier may include any type of machine learning algorithm/classifier and/or deep learning technique or classifier known in the art including, but not limited to, a random forest classifier, a support vector machine (SVM) classifier, an ensemble learning classifier, an artificial neural network (ANN), and the like. By way of another example, the machine learning classifier may include a deep convolutional neural network (CNN). For instance, in some embodiments, the machine learning classifier may include ALEXNET and/or GOOGLENET. In this regard, the machine learning classifier may include any algorithm, classifier, or predictive model configured to determine one or more focus errors.

It is further noted that the one or more fabrication simulations and the one or more calibration simulations may be performed on varying illumination and/or focus conditions. For example, the one or more fabrication simulations and the one or more calibration simulations may be performed using illumination and/or focus conditions that may correspond to a variation in one or more process tools of the system 200 (e.g., the fabrication tool 210), including, without limitation, deviations with respect to the one or more process tools (e.g., drift that occurs as the one or more process tools become aged).

Figure 7:
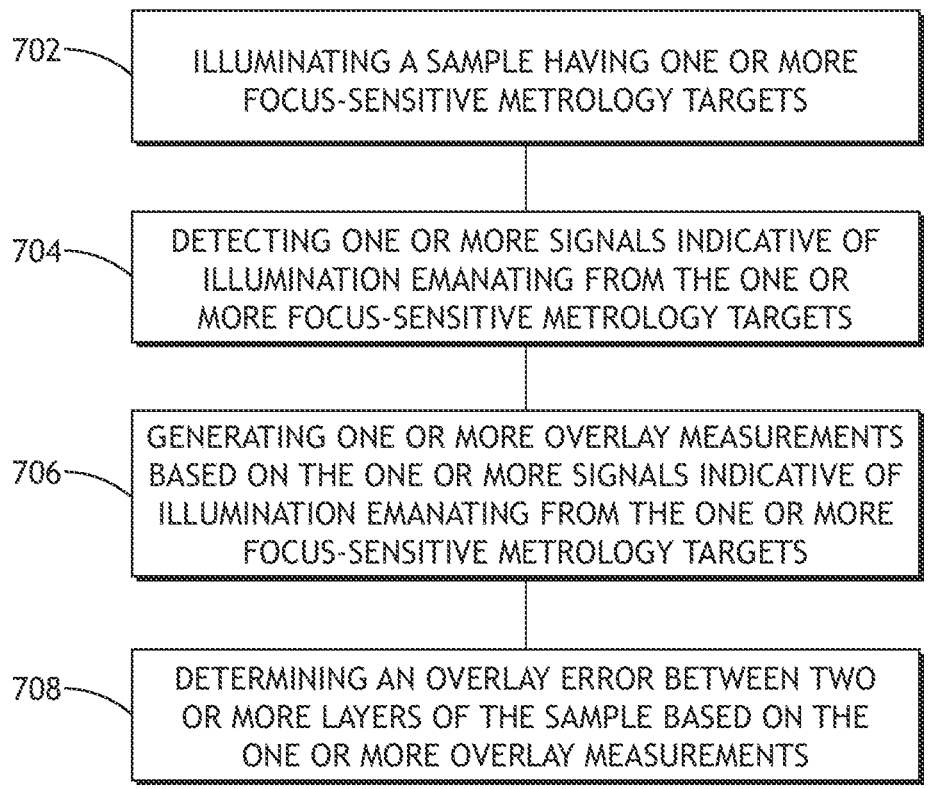
FIG. 7 is a process flow diagram depicting the steps of a method of measuring overlay, in accordance with one or more embodiments of the present disclosure.

FIG. 7 illustrates a process flow diagram depicting the steps of a method 700 of measuring overlay of a sample, in accordance with one or more embodiments of the present disclosure.

In Step 702, a sample including one or more focus-sensitive metrology targets 100 is illuminated. For example, the one or more metrology tools 202 may direct an illumination beam onto the sample. As used herein, the term "illumination beam" may refer to any radiant beam, including, without limitation, the optical illumination beam 304.

In Step 704, illumination emanating from the one or more focus-sensitive metrology targets 100 is detected. For example, the optical illumination beam may be detected. By way of another example, the one or more metrology tools 202 may be configured to detect illumination emanating from one or more portions of the one or more focus-sensitive metrology targets 100 (e.g., the first set of first target structures 102a and 102b, the second set of first target structures 108a and 108b, the first set of second target structures 104a and 104b, the second set of second target structures 110a and 110b, the first set of third target structures 106a and 106b, the second set of third target structures 112a and 112b, and/or the first set of fourth target structures 115a and 115b).

In Step 706, one or more overlay measurements are generated based on the one or more signals indicative of illumination emanating from the one or more focus-sensitive metrology targets 100. For example, the controller 204 may be configured to generate one or more overlay measurements of the sample based on one or more signals indicative of illumination emanating from one or more portions of the sample (e.g., the first set of first target structures 102a and 102b, the second set of first target structures 108a and 108b, the first set of second target structures 104a and 104b, the second set of second target structures 110a and 110b, the first set of third target structures 106a and 106b, the second set of third target structures 112a and 112b, and/or the first set of fourth target structures 115a and 115b). The one or more overlay measurements of the sample may correspond to an overlay position of one or more layers of the sample. The controller 204 may be configured to generate one or more corrected overlay measurements by correcting one or more uncorrected overlay measurements (e.g., overlay measurements taken without regard to proper and/or desired focus) using the one or more focus-offset values. In this regard, the controller 204 may be configured to provide one or more focus corrections determined based on the one or more focus-offset values to one or more portions of the one or more metrology tools 202, and the one or more metrology tools 202 may be configured to generate additional metrology measurements using the corrected focus based on the one or more focus corrections.

In Step 708, one or more overlay errors of the sample are determined. For example, the controller 204 may be configured to determine one or more overlay errors between two or more layers of the sample based on the one or more overlay measurements of the sample.

In some embodiments, the method 700 may include one or more additional steps wherein one or more overlay corrections are provided based on the one or more overlay errors determined in at least Step 708. For example, the one or more additional steps may include the controller 204 generating one or more control signals (or corrections to the control signals) for adjusting one or more parameters (e.g., fabrication settings, configuration, and the like) of one or more process tools (e.g., lithographic tools). The control signals (or corrections to the control signals) may be provided by the controller 204 as part of a feedback and/or feedforward control loop. The controller 204 may cause the one or more process tools to execute one or more adjustments to the one or more parameters of the one or more process tools based on the one or more control signals (or corrections to the control signals). In some embodiments, the controller 204 may alert a user to make the one or more adjustments. In this sense, the one or more control signals may compensate for errors of one or more fabrication processes of the one or more process tools, and thus may enable the one or more process tools to maintain overlay within selected tolerances across multiple exposures on subsequent samples in the same or different lots.

Figure 8:
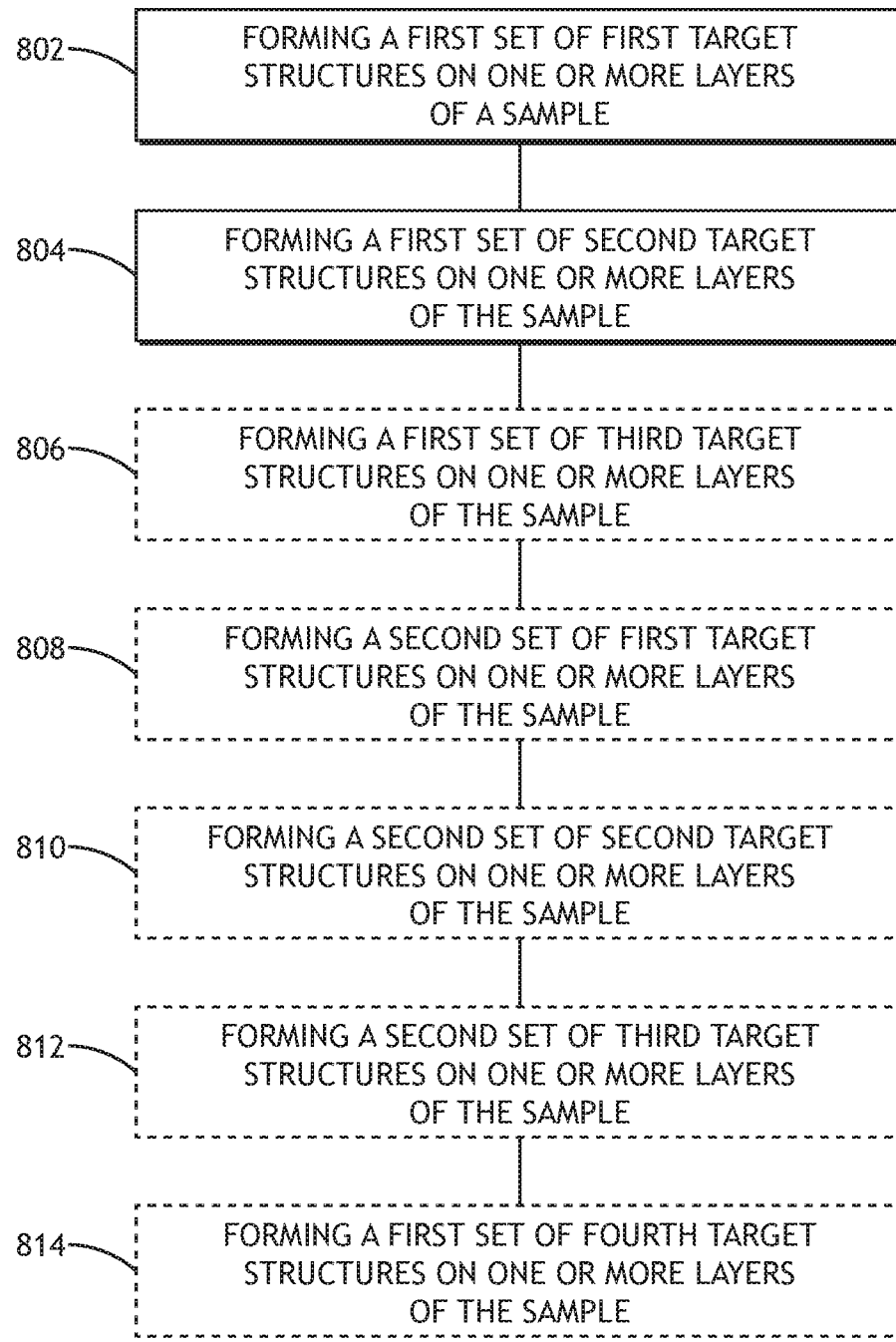
FIG. 8 is a process flow diagram depicting the steps of a method of forming a focus-sensitive metrology target, in accordance with one or more embodiments of the present disclosure.

FIG. 8 illustrates a process flow diagram illustrating the steps of a method 800 of forming a focus-sensitive metrology target 100, in accordance with one or more embodiments of the present disclosure.

In Step 802, a first set of first target structures 102a and 102b is formed on one or more layers of a sample. For example, the first set of first target structures 102a and 102b may be formed along a y-direction on the one or more layers of the sample, wherein the first set of first target structures 102a and 102b may include a plurality of segmented first pattern elements 103a and 103b. The plurality of segmented first pattern elements 103a and 103b may be configured for overlay measurement along at least one measurement direction (e.g., a y-direction). The plurality of segmented first pattern elements 103a and 103b may be compatible with any metrology mode known in the art to be suitable for the purposes contemplated by the present disclosure. For example, the one or more first pattern elements 103a and 103b may be compatible with a diffraction-based metrology mode (e.g., a scatterometry-based overlay (SCOL) metrology mode).

In this regard, the one or more first pattern elements 103a and 103b may be configured to include periodic and/or segmented structures for metrology using diffraction-based metrology methods (e.g., grating-over-grating structures, or any structure known in the art to be suitable for diffracting, scattering, and/or reflecting an illumination beam). By way of another example, the one or more first pattern elements 103a and 103b may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of focus-sensitive metrology target features located on different sample layers). It is noted that the plurality of segmented first pattern elements 103a and 103b may include any one-dimensional or two-dimensional structure formed by any means known in the art, including, without limitation, one or more lithographic steps, one or more direct etching steps, or the like. The first set of first target structures 102a and 102b and/or the plurality of segmented first pattern elements 103a and 103b may be formed in any shape, including, without limitation, a square shape, a round shape, a rhombus-like shape, or a star-like shape. The first set of first target structures 102a and 102b may be fabricated through one or more process steps such as, but not limited to, one or more deposition, lithographic, or etching steps, and through the use of one or more process tools (e.g., lithographic tools).

In Step 804, a first set of second target structures 104a and 104b is formed on one or more layers of a sample. For example, the first set of second target structures 104a and 104b may be formed along a y-direction on the one or more layers of the sample, wherein the first set of second target structures 104a and 104b may include a plurality of segmented second pattern elements 105a and 105b. The plurality of segmented second pattern elements 105a and 105b may be tools configured for overlay measurement along at least one measurement direction (e.g., a y-direction). The plurality of segmented second pattern elements 105a and 105b may be compatible with any metrology mode known in the art to be suitable for the purposes contemplated by the present disclosure. For example, the one or more second pattern elements 105a and 105b may be compatible with a diffraction-based metrology mode (e.g., a scatterometry-based overlay (SCOL) metrology mode). In this regard, the one or more second pattern elements 105a and 105b may be configured to include periodic and/or segmented structures for metrology using diffraction-based metrology methods (e.g., grating-over-grating structures, or any structure known in the art to be suitable for diffracting, scattering, and/or reflecting an illumination beam). By way of another example, the one or more second pattern elements 105a and 105b may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of focus-sensitive metrology target features located on different sample layers). It is noted that the plurality of segmented second pattern elements 105a and 105b may include any one-dimensional or two-dimensional structure formed by any means known in the art, including, without limitation, one or more lithographic steps, one or more direct etching steps, or the like. The first set of second target structures 104a and 104b and/or the plurality of segmented second pattern elements 105a and 105b may be formed in any shape, including, without limitation, a square shape, a round shape, a rhombus-like shape, or a star-like shape. The first set of second target structures 104a and 104b may be fabricated through one or more process steps such as, but not limited to, one or more deposition, lithographic, or etching steps, and through the use of one or more process tools (e.g., lithographic tools).

In some embodiments, the method 800 may include a Step 806, wherein a first set of third target structures 106a and 106b is formed on one or more layers of a sample. For example, the first set of third target structures 106a and 106b may be formed along a y-direction on the one or more layers of the sample, wherein the first set of third target structures 106a and 106b may include the plurality of segmented third pattern elements 107a and 107b. The plurality of segmented third pattern elements 107a and 107b may be configured for overlay measurement along at least one measurement direction (e.g., a y-direction). The plurality of segmented third pattern elements 107a and 107b may be compatible with any metrology mode known in the art to be suitable for the purposes contemplated by the present disclosure. For example, the one or more third pattern elements 107a and 107b may be compatible with a diffraction-based metrology mode (e.g., a scatterometry-based overlay (SCOL) metrology mode). In this regard, the one or more third pattern elements 107a and 107b may be configured to include periodic and/or segmented structures for metrology using diffraction-based metrology methods (e.g., grating-over-grating structures, or any structure known in the art to be suitable for diffracting, scattering, and/or reflecting an illumination beam). By way of another example, the one or more third pattern elements 107a and 107b may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of focus-sensitive metrology target features located on different sample layers). It is noted that the plurality of segmented third pattern elements 107a and 107b may include any one-dimensional or two-dimensional structure formed by any means known in the art, including, without limitation, one or more lithographic steps, one or more direct etching steps, or the like. The first set of third target structures 106a and 106b and/or the plurality of segmented third pattern elements 107a and 107b may be formed in any shape, including, without limitation, a square shape, a round shape, a rhombus-like shape, or a star-like shape. The first set of third target structures 106a and 106b may be fabricated through one or more process steps such as, but not limited to, one or more deposition, lithographic, or etching steps, and through the use of one or more process tools (e.g., lithographic tools).

In some embodiments, the method 800 may include a Step 808, wherein a second set of first target structures 108a and 108b is formed on one or more layers of a sample. For example, the second set of first target structures 108a and 108b may be formed along a x-direction on the one or more layers of the sample, wherein the second set of first target structures 108a and 108b may include a plurality of segmented first pattern elements 103c and 103d having the first pitch, the second pitch, or the third pitch. The plurality of segmented first pattern elements 103c and 103d may be configured for overlay measurement along at least one measurement direction (e.g., an x-direction). The plurality of segmented first pattern elements 103c and 103d may be compatible with any metrology mode known in the art to be suitable for the purposes contemplated by the present disclosure. For example, the one or more first pattern elements 103c and 103d may be compatible with a diffraction-based metrology mode (e.g., a scatterometry-based overlay (SCOL) metrology mode). In this regard, the one or more first pattern elements 103c and 103d may be configured to include periodic and/or segmented structures for metrology using diffraction-based metrology methods (e.g., grating-over-grating structures, or any structure known in the art to be suitable for diffracting, scattering, and/or reflecting an illumination beam). By way of another example, the one or more first pattern elements 103c and 103d may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of focus-sensitive metrology target features located on different sample layers). It is noted that the plurality of segmented first pattern elements 103c and 103d may include any one-dimensional or two-dimensional structure formed by any means known in the art, including, without limitation, one or more lithographic steps, one or more direct etching steps, or the like. The second set of first target structures 108a and 108b and/or the plurality of segmented first pattern elements 103c and 103d may be formed in any shape, including, without limitation, a square shape, a round shape, a rhombus-like shape, or a star-like shape. The second set of first target structures 108a and 108b may be fabricated through one or more process steps such as, but not limited to, one or more deposition, lithographic, or etching steps, and through the use of one or more process tools (e.g., lithographic tools).

In some embodiments, the method 800 includes a Step 810, wherein a second set of second target structures 110a and 110b is formed on one or more layers of a sample. For example, the second set of second target structures 110a and 110b may be formed along an x-direction on the one or more layers of the sample, wherein the second set of second target structures 110a and 110b may include a plurality of segmented second pattern elements 105c and 105d having the first pitch, the second pitch, or the third pitch. The plurality of segmented second pattern elements 105c and 105d may be configured for overlay measurement along at least one measurement direction (e.g., an x-direction). The plurality of segmented second pattern elements 105c and 105d may be compatible with any metrology mode known in the art to be suitable for the purposes contemplated by the present disclosure. For example, the one or more second pattern elements 105c and 105d may be compatible with a diffraction-based metrology mode (e.g., a scatterometry-based overlay (SCOL) metrology mode). In this regard, the one or more second pattern elements 105c and 105d may be configured to include periodic and/or segmented structures for metrology using diffraction-based metrology methods (e.g., grating-over-grating structures, or any structure known in the art to be suitable for diffracting, scattering, and/or reflecting an illumination beam). By way of another example, the one or more second pattern elements 105c and 105d may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of focus-sensitive metrology target features located on different sample layers). It is noted that the plurality of segmented second pattern elements 105c and 105d may include any one-dimensional or two-dimensional structure formed by any means known in the art, including, without limitation, one or more lithographic steps, one or more direct etching steps, or the like. The second set of second target structures 110a and 110b and/or the plurality of segmented second pattern elements 105c and 105d may be formed in any shape, including, without limitation, a square shape, a round shape, a rhombus-like shape, or a star-like shape. The second set of second target structures 110a and 110b may be fabricated through one or more process steps such as, but not limited to, one or more deposition, lithographic, or etching steps, and through the use of one or more process tools (e.g., lithographic tools).

In some embodiments, the method 800 includes a Step 812, wherein a second set of third target structures 112a and 112b is formed on one or more layers of the sample. For example, the second set of third target structures 112a and 112b may be formed along an x-direction on the one or more layers of the sample, wherein the second set of third target structures 112a and 112b may include a plurality of segmented third pattern elements 107c and 107d having the first pitch, the second pitch, or the third pitch. The plurality of segmented third pattern elements 107c and 107d may be configured for overlay measurement along at least one measurement direction (e.g., an x-direction). The plurality of segmented third pattern elements 107c and 107d may be compatible with any metrology mode known in the art to be suitable for the purposes contemplated by the present disclosure. For example, the one or more third pattern elements 107d and 107d may be compatible with a diffraction-based metrology mode (e.g., a scatterometry-based overlay (SCOL) metrology mode). In this regard, the one or more third pattern elements 107c and 107d may be configured to include periodic and/or segmented structures for metrology using diffraction-based metrology methods (e.g., grating-over-grating structures, or any structure known in the art to be suitable for diffracting, scattering, and/or reflecting an illumination beam). By way of another example, the one or more third pattern elements 107c and 107d may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of focus-sensitive metrology target features located on different sample layers). It is noted that the plurality of segmented third pattern elements 107c and 107d may include any one-dimensional or two-dimensional structure formed by any means known in the art, including, without limitation, one or more lithographic steps, one or more direct etching steps, or the like. The first set of second target structures 112a and 112b and/or the plurality of segmented third pattern elements 107c and 107d may be formed in any shape, including, without limitation, a square shape, a round shape, a rhombus-like shape, or a star-like shape. The second set of third target structures 112a and 112b may be fabricated through one or more process steps such as, but not limited to, one or more deposition, lithographic, or etching steps, and through the use of one or more process tools (e.g., lithographic tools).

In some embodiments, the method 800 includes a Step 814 wherein a first set of fourth target structures 115a and 115b is formed on one or more layers of a sample. For example, the first set of fourth target structures 115a and 115b may be formed along a y-direction on the one or more layers of the sample, wherein the first set of fourth target structures 115a and 115b may include a plurality of segmented fourth pattern elements 116a and 116b having a Moiré pattern. The plurality of segmented fourth pattern elements 116a and 116b may be configured for overlay measurement along at least one measurement direction (e.g., a y-direction). The plurality of segmented fourth pattern elements 116a and 116b may be compatible with any metrology mode known in the art to be suitable for the purposes contemplated by the present disclosure. For example, the one or more fourth pattern elements 116a and 116b may be compatible with a diffraction-based metrology mode (e.g., a scatterometry-based overlay (SCOL) metrology mode). In this regard, the one or more fourth pattern elements 116a and 116b may be configured to include periodic and/or segmented structures for metrology using diffraction-based metrology methods (e.g., grating-over-grating structures, or any structure known in the art to be suitable for diffracting, scattering, and/or reflecting an illumination beam). By way of another example, the one or more fourth pattern elements 116a and 116b may be compatible with any image-based overlay metrology mode, including, without limitation, an advanced imaging metrology (AIM) mode, a box-in-box metrology mode, or any other metrology mode known in the art to be suitable for capturing an overlay signal (e.g., an image of focus-sensitive metrology target features located on different sample layers). It is noted that the plurality of segmented fourth pattern elements 116a and 116b may include any one-dimensional or two-dimensional structure formed by any means known in the art, including, without limitation, one or more lithographic steps, one or more direct etching steps, or the like. The first set of fourth target structures 115a and 115b and/or the plurality of segmented fourth pattern elements 116a and 116b may be formed in any shape, including, without limitation, a square shape, a round shape, a rhombus-like shape, or a star-like shape. It is further noted that the first set of fourth target structures 115a and 115b may allow the focus-sensitive metrology target 100 to be used for more accurate overlay metrology measurements. For example, the inclusion of the first set of fourth target structures 115a and 115b with the first set of first target structures 102a and 102b, the first set of second target structures 104a and 104b, and/or the first set of third target structures 106a and 106b may allow for additional metrology measurements based on one or more signals emanating from the first set of first target structures 102a and 102b, the first set of second target structures 104a and 104b, the first set of third target structures 106a, and/or the first set of fourth target structures 115a and 115b.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A focus-sensitive metrology target comprising:
a first set of first target structures formed along a y-direction on one or more layers of a sample, the first set of first target structures comprising a plurality of segmented first pattern elements; and
a first set of second target structures formed along a y-direction on one or more layers of the sample, the first set of second target structures comprising a plurality of segmented second pattern elements, wherein one or more focus-offset values are determinable for the focus-sensitive metrology target based on illumination reflected or scattered from the first set of first target structures and the first set of second target structures by translating one or more signals indicative of the illumination into a focus-offset value using a calibration curve.

2. The focus-sensitive metrology target of claim 1, wherein the segmented first pattern elements and the segmented second pattern elements each comprise a plurality of pattern elements having at least one of a first pitch or a second pitch, wherein the first pitch is greater than a resolution of one or more portions of one or more metrology tools and the second pitch is less than the resolution of the one or more portions of the one or more metrology tools.

3. The focus-sensitive metrology target of claim 2, further comprising:
a second set of first target structures formed along an x-direction on one or more layers of the sample, the second set of first target structures comprising a plurality of segmented first pattern elements having at least one of the first pitch or the second pitch;
a second set of second target structures formed along the x-direction on one or more layers of the sample, the second set of second target structures comprising a plurality of segmented second pattern elements having at least one of the first pitch or the second pitch; and
a second set of third target structures formed along the x-direction on one or more layers of the sample, the second set of third target structures comprising a plurality of segmented third pattern elements having at least one of the first pitch, the second pitch, or the third pitch.

4. The focus-sensitive metrology target of claim 3, further comprising:
a first set of third target structures formed on one or more layers of the sample, the first set of third target structures comprising a plurality of segmented third pattern elements comprising a Moiré pattern formed along the y-direction from overlapping periodic structures on two layers of the sample, wherein periods of the overlapping periodic structures are different; and
a first set of fourth target structures formed on one or more layers of the sample, the first set of fourth target structures comprising a plurality of segmented fourth pattern elements comprising a Moiré pattern formed along the y-direction from overlapping periodic structures on two layers of the sample, wherein periods of the overlapping periodic structures are different.

5. The focus-sensitive metrology target of claim 2, wherein the one or more fabrication tools comprise at least one of an extreme ultraviolet (EUV) scanner or one or more lithographic tools.

6. The focus-sensitive metrology target of claim 1, wherein the segmented first pattern elements and the segmented second pattern elements each comprise a Moiré pattern formed along the y-direction from overlapping periodic structures on two layers of the sample, wherein periods of the overlapping periodic structures are different.

7. The focus-sensitive metrology target of claim 1, wherein the sample comprises a semiconductor wafer.

8. A method of forming a focus-sensitive metrology target comprising:
forming a first set of first target structures along a y-direction on one or more layers of a sample, the first set of first target structures comprising a plurality of segmented first pattern elements; and
forming a first set of second target structures along a y-direction on one or more layers of the sample, the first set of second target structures comprising a plurality of segmented second pattern elements, wherein one or more focus-offset values are determinable for the focus-sensitive metrology target based on illumination reflected or scattered from the first set of first target structures and the first set of second target structures by translating one or more signals indicative of the illumination into a focus-offset value using a calibration curve.

9. The method of claim 8, wherein the segmented first pattern elements and the segmented second pattern elements each comprise a plurality of pattern elements having at least one of a first pitch or a second pitch, wherein the first pitch is greater than a resolution of one or more portions of one or more metrology tools and the second pitch is less than the resolution of the one or more portions of the one or more metrology tools.

10. The method of claim 9, further comprising:
forming a second set of first target structures along an x-direction on one or more layers of the sample, the second set of first target structures comprising a plurality of segmented first pattern elements having at least one of the first pitch or the second pitch;
forming a second set of second target structures along the x-direction on one or more layers of the sample, the second set of second target structures comprising a plurality of segmented second pattern elements having at least one of the first pitch or the second pitch; and forming a second set of third target structures along the x-direction on one or more layers of the sample, the second set of third target structures comprising a plurality of segmented third pattern elements having at least one of the first pitch, the second pitch, or the third pitch.

11. The method of claim 10, further comprising:

forming a first set of third target structures on one or more layers of the sample, the first set of third target structures comprising a plurality of segmented third pattern elements, the plurality of segmented third pattern elements comprising a Moiré pattern formed along the y-direction from overlapping periodic structures on two layers of the sample, wherein periods of the overlapping periodic structures are different; and forming a first set of fourth target structures on one or more layers of the sample, the first set of fourth target structures comprising a plurality of segmented fourth pattern elements, the plurality of segmented fourth pattern elements comprising a Moiré pattern formed along the y-direction from overlapping periodic structures on two layers of the sample, wherein periods of the overlapping periodic structures are different.

12. The method of claim 8, wherein the segmented first pattern elements and the segmented second pattern elements each comprise a Moiré pattern formed along the y-direction from overlapping periodic structures on two layers of the sample, wherein periods of the overlapping periodic structures are different.

13. The method of claim 8, wherein the sample comprises a semiconductor wafer.

* * * * *